United States Patent
Haken et al.

(10) Patent No.: US 6,411,223 B1
(45) Date of Patent: Jun. 25, 2002

(54) GENERATING HIGH WEIGHT ENCODING SYMBOLS USING A BASIS

(75) Inventors: Armin Haken, San Francisco; Michael G. Luby, Berkeley; Gavin Horn, Emeryville; Diane Hernek, Oakland, all of CA (US); John Byers, Newton; Michael Mitzenmacher, Belmont, both of MA (US)

(73) Assignee: Digital Fountain, Inc., Fremont, CA (US)

( * ) Notice: Subject to any disclaimer, the term of this patent is extended or adjusted under 35 U.S.C. 154(b) by 0 days.

(21) Appl. No.: 09/691,735

(22) Filed: Oct. 18, 2000

(51) Int. Cl.[7] .............................. H03M 7/00; H03M 7/34
(52) U.S. Cl. ............................. 341/50; 341/51; 341/60; 341/55; 395/200.3; 714/15
(58) Field of Search .................. 341/50, 55, 60, 341/51; 375/254, 230; 395/200.3, 161; 714/15, 746

(56) References Cited

U.S. PATENT DOCUMENTS

| | | | | |
|---|---|---|---|---|
| 4,365,338 A | * | 12/1982 | McRae et al. | 375/12 |
| 5,432,787 A | * | 7/1995 | Chethik | 371/37.7 |
| 5,617,541 A | * | 4/1997 | Albanese et al. | 395/200.13 |
| 5,889,794 A | * | 3/1999 | Mo et al. | 371/37.11 |
| 5,992,737 A | * | 11/1999 | Kubota | 395/161 |
| 5,993,056 A | * | 11/1999 | Vaman et al. | 371/37.02 |
| 6,212,657 B1 | * | 4/2001 | Wang et al. | 714/746 |
| 6,292,514 B1 | * | 9/2001 | Yamaguchi et al. | 375/240.21 |
| 6,307,487 B1 | * | 10/2001 | Luby | 341/50 |

* cited by examiner

Primary Examiner—Peguy JeanPierre
Assistant Examiner—Jean Bruner Jeanglaude
(74) Attorney, Agent, or Firm—Townsend and Townsend and Crew LLP

(57) ABSTRACT

Output symbols are generated using input symbols and basis elements. A plurality of basis elements are generated. Each basis element is generated from a predetermined function of associated input symbols associated with the basis element. For each output symbol, a set of associated basis elements associated with the output symbol is determined, and a set of direct associated input symbols directly associated with the output symbol is determined. For each output symbol, the output symbol is generated from a predetermined function of the associated basis elements and the associated input symbols.

42 Claims, 22 Drawing Sheets

GENERATING HIGH WEIGHT ENCODING SYMBOLS USING A BASIS

CROSS-REFERENCES TO RELATED APPLICATIONS

The present disclosure builds on the teachings of U.S. Pat. No. 6,307,487, issued Oct. 23, 2001 (U.S. patent application Ser. No. 09/246,015, filed Feb. 5, 1999 and entitled "Information Additive Code Generator And Decoder For Communication Systems") (hereinafter "Luby I") and U.S. Pat. No. 6,320,520, issued Nov. 20, 2001 (U.S. patent application Ser. No. 09/399,201, filed Sep. 17, 1999 and entitled "Information Additive Group Code Generator And Decoder For Communication Systems") (hereinafter "Luby II"), both of which are incorporated herein by reference for all purposes.

FIELD OF THE INVENTION

The present invention relates to encoding and decoding data in communications systems and more specifically to communications systems that encode and decode data wherein output symbols with high weights are generated using basis symbols.

BACKGROUND OF THE INVENTION

In forward error correcting codes, such as erasure codes, an encoded output symbol is generated based on a set of input symbols. The size of the set of input symbols for a particular encoded output symbol is referred to as the weight of the encoded output symbol. Generally, the higher the weight of an encoded output symbol, the more computationally expensive it is to generate that encoded output symbol.

Some error correcting code systems vary the weight of encoded output symbols over a large range of weights. Examples of such systems include chain reaction coding systems, which are described in Luby I and Luby II. In one embodiment, for example, an encoder generates an output symbol from a key, I, of the output symbol, where the number of possible keys, and therefore output symbols, is much larger than the number of input symbols. The encoder determines a list, AL(I), of W(I) input symbols to be associated with the output symbol and calculates a value, B(I), for the output symbol. The weight W(I) of an output symbol may vary for different values of the key I.

Luby I and Luby II describe various methods and apparatus for calculating W(I) from I, calculating AL(I) from I and W(I), and generating B(I) from one or more of AL(I), W(I) and I. The decoder receives output symbols, and when sufficient output symbols are received, the decoder can calculate values for input symbols from the values of the output symbols. This process is referred to herein as "chain reaction coding" because once a decoder decodes an input symbol, that result can be used in combination with information about other received output symbols to decode more input symbols, which in turn may lead to an ability to decode even more input symbols.

Where the encoder and decoder are optimized, the decoder can entirely recover an input file of K input symbols from a received set of K+α output symbols most of the time. In one decoding process, the decoder waits for receipt of K+α output symbols. In many communications systems, the channel is not perfect, so some output symbols may have been lost. In general, the decoder does not assume that it has received a specific or contiguous K+α output symbols, but instead operates on the assumption that the particular K+α output symbols are randomly distributed among the possible output symbols. In a decoding process, the decoder uses the K+α output symbols to attempt to decode as many of the input symbols as possible. With the proper selection of α, most of the time, the decoder will decode all of the input symbols before using all of the K+α output symbols. In the ideal case, the decoder just finishes recovering all of the input symbols when it runs out of output symbols, so that no output symbols are wasted and no more output symbols are needed. Of course, since the decoder cannot control which of the possible output symbols are going to be received at the decoder, some transmissions of K+α output symbols will include more output symbols than needed and some transmissions of K+α output symbols might not be enough to decode all of the input symbols, in which case the decoder would take additional output symbols from the channel to complete the decoding process.

In chain reaction coding, for example, a relatively small number of the output symbols may have a high weight. For instance, some output symbols may have weights in the hundreds or thousands of input symbols, or even as high as K. The generation of these high weight output symbols tends to slow down the overall performance of the system. If this is not acceptable, then the cost of the system may be increased in order to handle the computationally expensive generation of these relatively few high weight output symbols.

SUMMARY OF THE INVENTION

According to the invention, a method of generating output symbols is provided. Each output symbol is selected from an output alphabet and each output symbol is such that an input file, comprising an ordered plurality of input symbols each selected from an input alphabet, is recoverable from a set of such output symbols. The method comprises generating a plurality of basis elements, wherein each basis element is generated from a predetermined function of associated input symbols associated with the basis element. The method also comprises, for each output symbol, determining a set of associated basis elements associated with the output symbol, and determining a set of direct associated input symbols directly associated with the output symbol. The method further comprises, for each output symbol, generating the output symbol from a predetermined function of the associated basis elements and the direct associated input symbols. For some output symbols, the set of associated basis elements might be the null set and for some other (or even all) output symbols, the set of direct associated input symbols might be the null set.

In another aspect of the invention, a data signal is provided. The data signal comprises output symbols. Each output symbol is selected from an output alphabet and each output symbol is such that an input file, comprising an ordered plurality of input symbols each selected from an input alphabet, is recoverable from a set of such output symbols. The output symbols are generated using a method that includes generating a plurality of basis elements, wherein each basis element is generated from a predetermined function of associated input symbols associated with the basis element. The method also includes for each output symbol, determining a set of associated basis elements associated with the output symbol, and determining a set of direct associated input symbols directly associated with the output symbol. The method additionally includes, for each output symbol, generating the output symbol from a predetermined function of the associated basis elements and the direct associated input symbols.

In yet another aspect of the invention, a method of decoding an input symbol from output symbols is provided. The output symbols are selected from an output alphabet and output symbols are such that an input file, comprising an ordered plurality of input symbols each selected from an input alphabet, is recoverable from a set of such output symbols. Also, each output symbol has a value calculated from one or more direct associated input symbols and/or one or more associated basis elements. The method includes, for each output symbol, determining a set of direct associated input symbols directly associated with the output symbol, and determining a set of indirect associated input symbols indirectly associated with the output symbol. The method also includes, for each output symbol, determining a weight of the output symbol, and initializing a count of the output symbol to the weight of the output symbol. The method additionally includes recovering input symbols using output symbols that have a current count less than or equal to a recovery value, and reducing the count of an output symbol of which a recovered input symbol is an associate to reflect the recovery of the associated input symbol.

One advantage of the present invention is that high weight output symbols may be generated with less computation and with less memory access when the high weight output symbols are generated using basis elements. Another advantage of the present invention is that high weight output symbols may be used in the decoding process with less computation and less memory access when the high weight output symbols are generated using basis elements.

DESCRIPTION OF THE SPECIFIC EMBODIMENTS

The present invention will be described in the context of a chain reaction coding system. However, it is to be understood that the invention is not limited to chain reaction coding systems.

Luby I and Luby II describe various chain reaction coding systems in detail. As described therein, a chain reaction encoder generates output symbols from input symbols of the input file as needed. Luby I/II define and describe various concepts relating to chain reaction coding and group chain reaction coding, and those teachings are incorporated by reference herein rather than restating them here in their entirety. Generally speaking, Luby I/II teach how to make and use a chain reaction coding encoder and decoder to transport data, including a process for generating an output symbol or a group of output symbols from selected input symbols.

Figure 1:
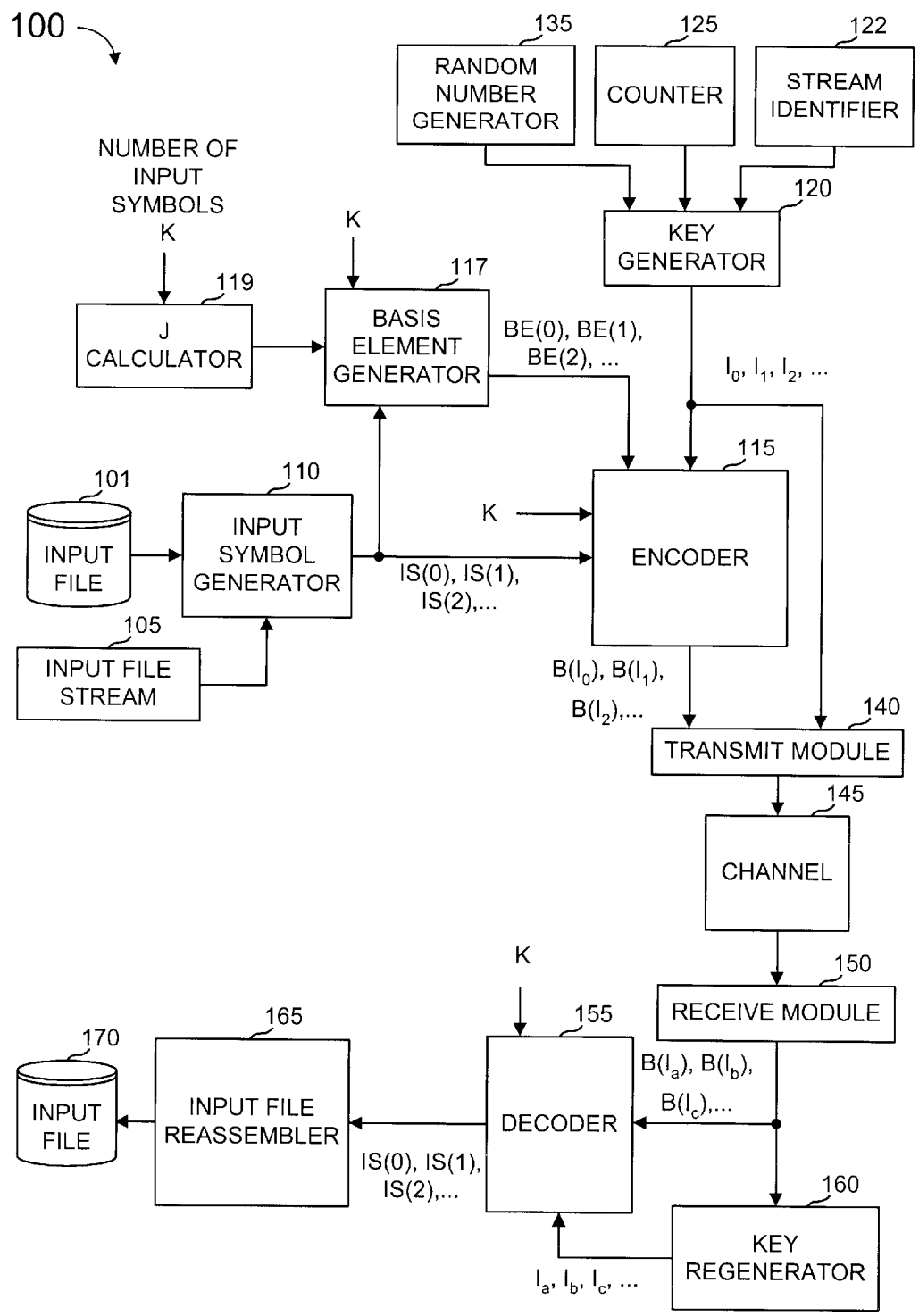
FIG. 1 is a block diagram of a communications system according to one embodiment of the invention.

FIG. 1 is a block diagram of a communications system 100 that uses chain reaction coding. In the communications system 100, an input file 101, or an input stream 105, is provided to an input symbol generator 110. Input symbol generator 110 generates a sequence of one or more input symbols (IS(0), IS(1), IS(2), . . . ) from the input file or stream, with each input symbol having a value and a position (denoted in FIG. 1 as a parenthesized integer). The output of input symbol generator 110 is provided to an encoder 115 and a basis element generator 117.

A J calculator 119 receives as an input K and generates a number J, which is provided to the basis element generator 117. J is the number of basis elements to be generated. If K is not known in advance, such as where the input is a streaming file, K can be just an estimate. Examples of the number J of basis elements will be described below with respect to specific embodiments.

Basis element generator 117 receives as inputs the number K of input symbols and the number J of basis elements to be generated, and generates a set of basis elements (BE(0), BE(1), BE(2), . . . ) from the input symbols provided by the input symbol generator 110, with each basis element having a value and a position (denoted in FIG. 1 as a parenthesized integer). Each basis element is generated based on a function of a plurality of input symbols. The function may be an associative operator, such as an exclusive-or (hereinafter "XOR"), or the like. The output of the basis element generator 117 is provided to the encoder 115. The plurality of input symbols used to generate a basis element are referred to herein as the basis element's "associated input symbols." Key generator 120 generates a key for each output symbol to be generated by encoder 115. Key generator 120 might use a combination of the output of a counter 125, a unique stream identifier 122, and/or the output of a random number generator 135 to produce each key. The output of key generator 120 is provided to the encoder 115. From each key I provided by key generator 120, the encoder 115 generates an output symbol, with a value B(I). The value of an output symbol is generated based on its key and on some function of (1) one or more input symbols provided by the input symbol generator 110, (2) one or more basis elements provided by the basis element generator 117, or (3) a combination of one or more input symbols and one or more basis elements. The input symbols used in generating an output symbol are referred to herein as the output symbol's "associated input symbols". Similarly, the basis elements used in generating an output symbol are referred to herein as the output symbol's "associated basis elements". An output symbol's associated input symbols and associated basis elements are referred to herein as the output symbol's "associates". The selection of the function (the "value function") and the associates is done according to a process described in more detail below.

An input symbol may be associated with an output symbol either directly, or indirectly. An input symbol is indirectly associated with an output symbol if the input symbol is an associate of a basis element that is itself an associate of the output symbol. Hence, an input symbol directly associated with an output symbol is referred to herein as a "direct" associate of the output symbol, while an input symbol indirectly associated with an output symbol is referred to herein as an "indirect associate" of the output symbol. The weight of an encoded output symbol is equal to the size of the set of input symbols that are direct or indirect associates of the output symbol.

In some embodiments, the number K of input symbols is used by the encoder 115 to select the associates. The value K might also be used by the encoder 115 to allocate storage for input symbols. Where the input is a streaming file, the one-pass windowing encoder shown in U.S. patent application Ser. No. 09/668,452, filed on Sep. 22, 2000 and entitled "On Demand Encoding With A Window" might be used, with K being set to the window size. U.S. patent application Ser. No. 09/668,452, filed on Sep. 22, 2000 and entitled "On Demand Encoding With A Window" is herein incorporated by reference for all purposes.

The encoder 115 provides output symbols to a transmit module 140. Transmit module 140 is also provided the key of each such output symbol from the key generator 120. Transmit module 140 transmits the output symbols, and depending on the keying method used, transmit module 140 might also transmit some data about the keys of the transmitted output symbols, over a channel 145 to a receive module 150. Transmit module 140 might include a buffer to store output symbols, thereby allowing transmit module 140 to transmit output symbols in an order that is different from the order in which transmit module 140 receives the output symbols.

Receive module 150 provides the output symbols to a decoder 155, and any data receive module 150 receives about the keys of these output symbols is provided to a key regenerator 160. Key regenerator 160 regenerates the keys for the received output symbols and provides these keys to decoder 155. Decoder 155 uses the keys provided by key regenerator 160 together with the corresponding output symbols, to recover the input symbols (again IS(0), IS(1), IS(2), . . . ). Decoder 155 provides the recovered input symbols to an input file reassembler 165, which generates a copy 170 of input file 101 or input stream 105.

Figure 2:
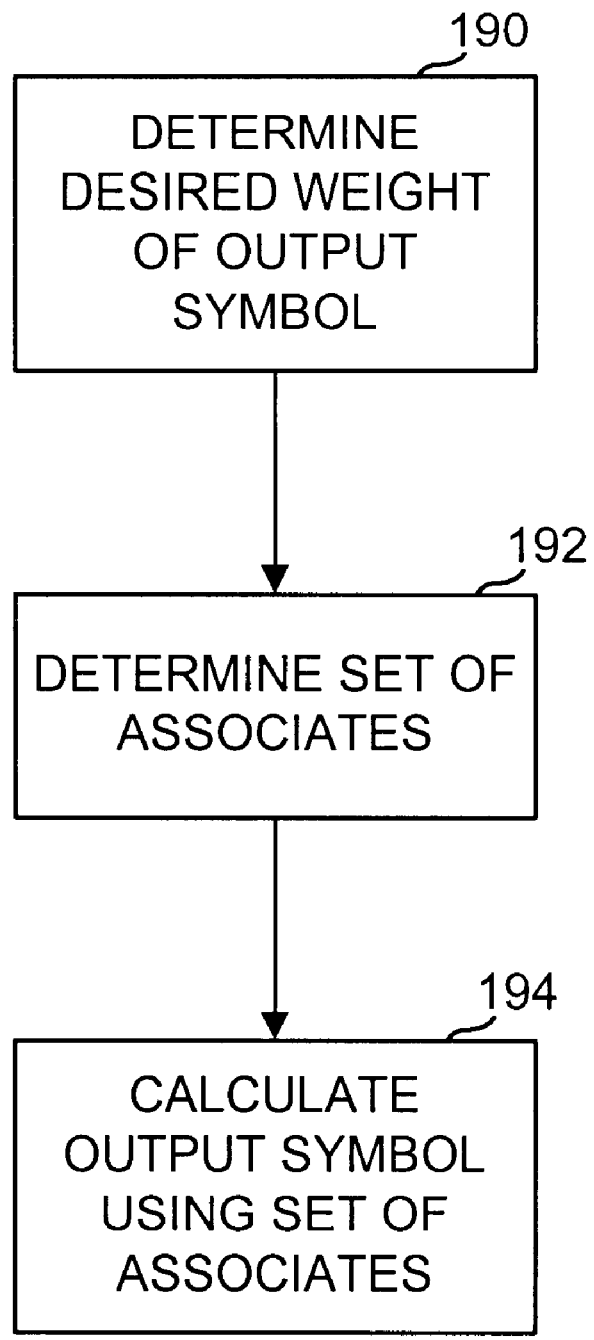
FIG. 2 is a simplified flow diagram of a method according to one embodiment of the invention.

FIG. 2 is a simplified flow diagram of a method according to an embodiment of the invention that may be implemented by an output symbol encoder such as, for example, the encoder 115 shown in FIG. 1. This diagram is merely for illustrative purposes and is not intended to limit the scope of the claims herein. FIG. 2 is a high-level flow diagram of a method for calculating output symbols. First, in a step 190, a desired weight of an output symbol is determined. Next, in a step 192, a set of associates is determined such that, when an output symbol is calculated using the set of associates, the resulting output symbol has a weight equal to, or substantially equal to, the desired weight. The set of associates may include only input symbols, only basis elements, or a combination of input symbols and basis elements. Selecting a set of associates will be described further with respect to FIGS. 3A–3D. Then, in a step 194, an output symbol is calculated using the set of associates determined in step 192.

Sets of Associates

Figure 3A:
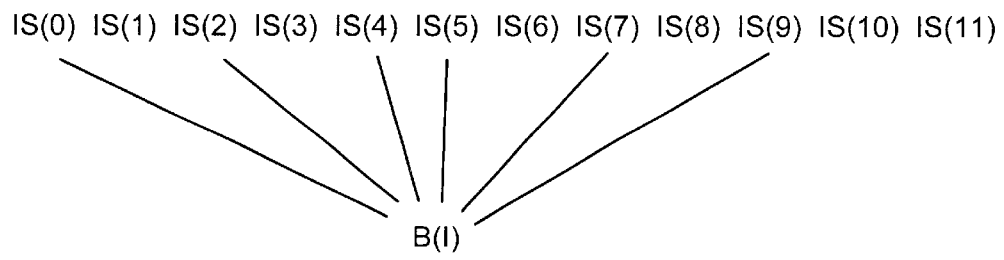
FIGS. 3A–3D illustrate various examples of sets of associates used to generate an output symbol.
Figure 3B:
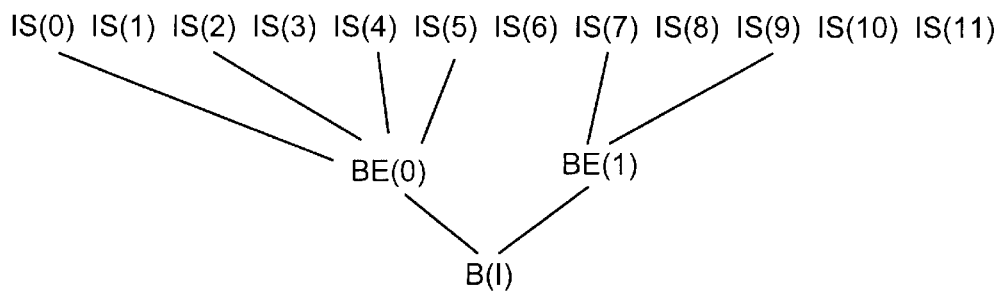

FIGS. 3A–3D illustrate various examples of sets of associates used to generate an output symbol when the desired weight of the output symbol is six. For instance, FIG. 3A illustrates an output symbol B(I) calculated using all directly associated input symbols. In particular, B(I) is calculated using six input symbols IS(0), IS(2), IS(4), IS(5), IS(7), and IS(9). Additionally, an output symbol may be calculated using only basis elements. FIG. 3B illustrates an output symbol of weight six calculated using two basis elements BE(0) and BE(1). Basis element BE(0) is itself calculated using four input symbols, IS(0), IS(2), IS(4), and IS(5). Thus, basis element BE(0) is of weight four. Similarly, basis element BE(1) is itself calculated using two input symbols, IS(7) and IS(9), giving it a weight of two. Thus, the weight of the resulting output symbol is the sum of the weights of its associated basis elements.

Figure 3C:
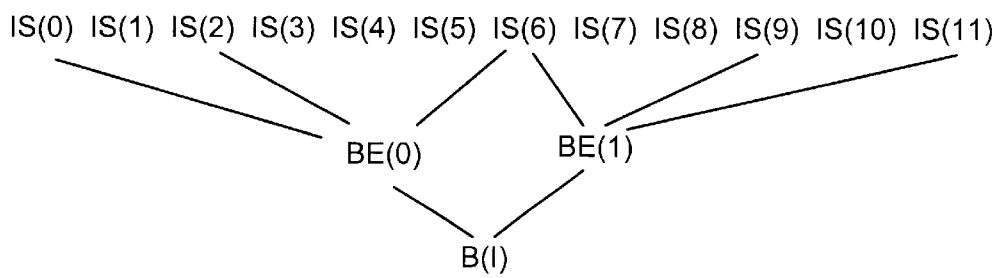
Figure 3D:
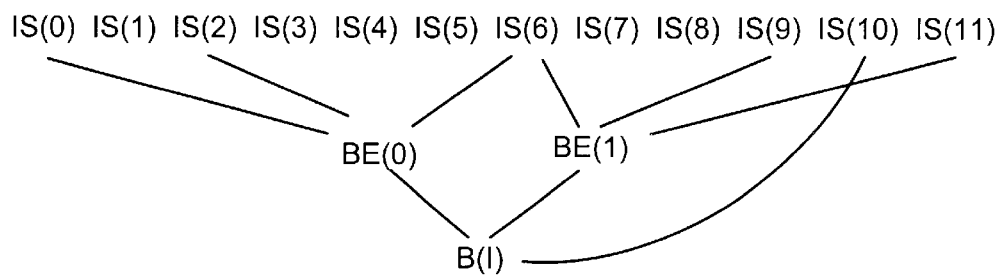

FIG. 3C illustrates calculating an output symbol using basis elements, where two basis elements are calculated using a common input symbol. In the case illustrated in FIG. 3C, both basis elements have a weight of three, and both are calculated using the input symbol IS(6). But, even though the weights of the basis elements sum to six, the effective weight of the output symbol is reduced from six, because only five input symbols are used. Depending on the value functions used to generate basis elements BE(0) and BE(1), and the output symbol B(1), the effective weight of the output symbol in FIG. 3C may be five or four. For instance, if the value functions are XOR, the input symbol IS(6) is effectively canceled out because the XOR of a value with itself is always zero. A designer may find this reduction in weight acceptable. If not, the reduction in weight may be compensated for in a manner similar to that illustrated in FIG. 3D. FIG. 3D illustrates calculating an output symbol using a combination of basis elements and input symbols. If, for example, the value functions are XOR, an input symbol (IS(10) in FIG. 3D) could be used in addition to basis elements BE(0) and BE(1) to calculate the output symbol B(I), and thus increase the effective output symbol weight from four to five.

As can be seen, a few basis elements can be used to generate an output symbol with a high weight. For example, an output symbol of weight 1000 could be generated using 10 basis elements, each of weight 100, rather than using 1000 input symbols. If basis elements are generated once, and then used multiple times, the overall computational load is reduced.

It is to be understood that FIGS. 3A–3D are merely simplified examples used for illustrative purposes. One skilled in the art would recognize many variations, modifications, and alternatives. For example, the reduction in an output symbol's weight due to basis elements sharing input symbols, as described with respect to FIG. 3C, may be used to obtain a desired output symbol weight. Referring again to FIG. 3C, if a desired weight is four, the basis elements BE(0) and BE(1) could be used to produce an output symbol of weight four (if the value functions were XOR, for example). Similarly, an output symbol of weight of ninety-nine could be generated by XOR-ing a basis element of weight one hundred with an input symbol included in the basis element.

A Basic Basis Element Generator

Figure 4:
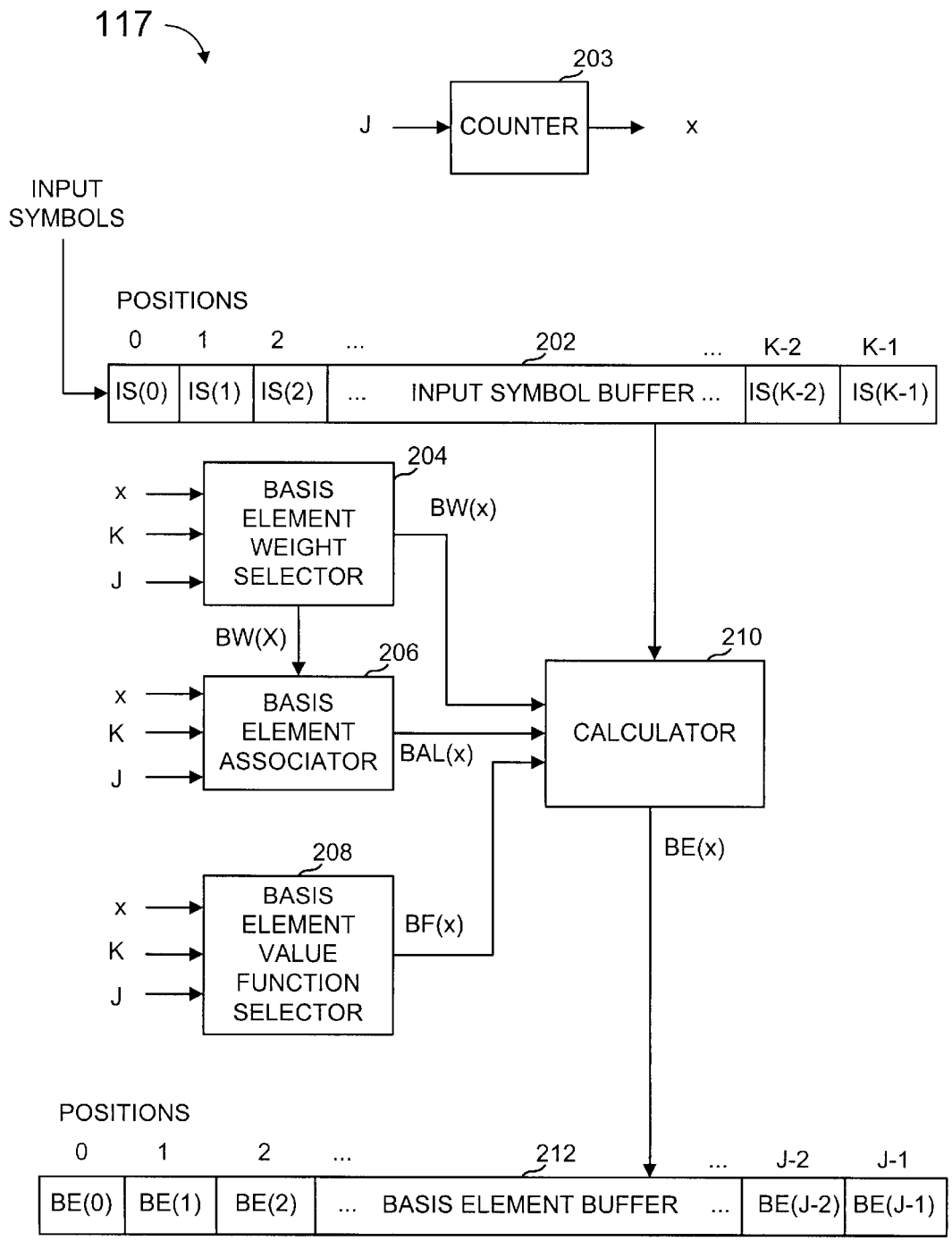
FIG. 4 is a block diagram of a basis element generator as might be used in the communications system shown in FIG. 1.

FIG. 4 is a simplified block diagram of an embodiment of the basis element generator 117 shown in FIG. 1. This diagram is merely for illustrative purposes and is not intended to limit the scope of the claims herein. One skilled in the art would recognize many other variations, modifications, and alternatives.

The basis element generator 117 is provided with input symbols and generates a plurality of basis elements. In some embodiments, the basis element generator 117 generates basis elements as they are needed by the encoder 115. In other embodiments, all of the basis elements are generated prior to the generation of output symbols by the encoder 115. As shown, K input symbols are stored in an input symbol buffer 202, where K is the number of input symbols. A counter 203 receives the number J of basis elements to be generated, and generates an index x. The index x may have values, for example, from 0 to J−1. A calculator 210 receives inputs from the input symbol buffer 202, a basis element associator 206, and a basis element value function selector 208, and calculates J basis element values BE(x). In some embodiments, the calculator 210 may also receive outputs from the basis element weight selector 204. Basis element values are stored in a basis element buffer 212. In some embodiments, the number J of basis elements is fixed beforehand and all J basis elements are generated in advance, or as needed. In one embodiment the total number of basis elements at any one time may be fixed as J beforehand, and, when more than J basis elements have been generated, each new basis element that is generated replaces an existing basis element. In other embodiments, J is not fixed.

The basis element weight selector 204 receives as inputs the number K of input symbols, the number J of basis elements, and an index x, and, for each basis element BE(x) to be generated, generates a weight BW(x) of the basis element. The basis element associator 206 receives as inputs the values K and J, the index x, and the weight BW(x), and produces a list of positions BAL(x) of input symbols to be used in generating the basis element BE(x). The basis element value function selector 208 receives the values K and J, and the index x, and generates a value function BF(x) to be used in generating the basis element BE(x).

In operation, K input symbols are received and stored in input symbol buffer 202. As described above, each input symbol has a position (i.e. its original position in the input file) and a value. The input symbols need not be stored in input symbol buffer 202 in their respective order, so long as the position of stored input symbols can be determined.

The basis element weight selector 204 selects the weights BW(x) for each of the basis elements BE(x) to be generated. Preferably, the selection of the weights BW(x) is performed in a way that the decoder can replicate if the decoder does not already have the weights available to it. Each weight BW(x) is provided to the calculator 210 and to the basis element associator 206.

The basis element associator 206 selects the positions of input symbols to be used in generating each basis element. In some embodiments, the input symbols to be used are selected in a random or pseudo-random manner. Preferably, the selection of the lists BAL(x) are performed in a way that the decoder can replicate if the decoder does not already have the lists BAL(x) available to it. Each list BAL(x) of input symbols is provided to the calculator 210. Examples of the selection of weights BW(x) and lists BAL(x) will be described below with respect to specific embodiments.

For each list BAL(x) of input symbols, the calculator 210 generates a basis element BE(x) based on a basis function BF(x) supplied by the basis element value function selector 208. One property of a suitable basis function is that it would allow the value for an input symbol in BAL(x) to be determined from the basis element BE(x) and from the values for the other BW(x)−1 input symbols in BAL(x). Another property of a suitable basis function is that it is an associative function. Further properties of a suitable basis function will be described below. One preferred basis function is the XOR value function, since it satisfies the above-mentioned properties, is easily computed, and is easily inverted. However, other suitable basis functions might be used instead. In some embodiments, the basis function may be the same function BF for all the basis elements BE(x). In these embodiments, the basis element value function selector 208 is not needed, and the calculator 210 can be configured with the value function BF.

After receiving the list BAL(x) of input symbols, the calculator 210 accesses the BW(x) input symbols referenced by BAL(x) in input symbol buffer 202 to calculate the value, BE(x), for the current basis element using the basis function BF(x). The generated basis elements are stored in a basis element buffer 212.

Figure 5:
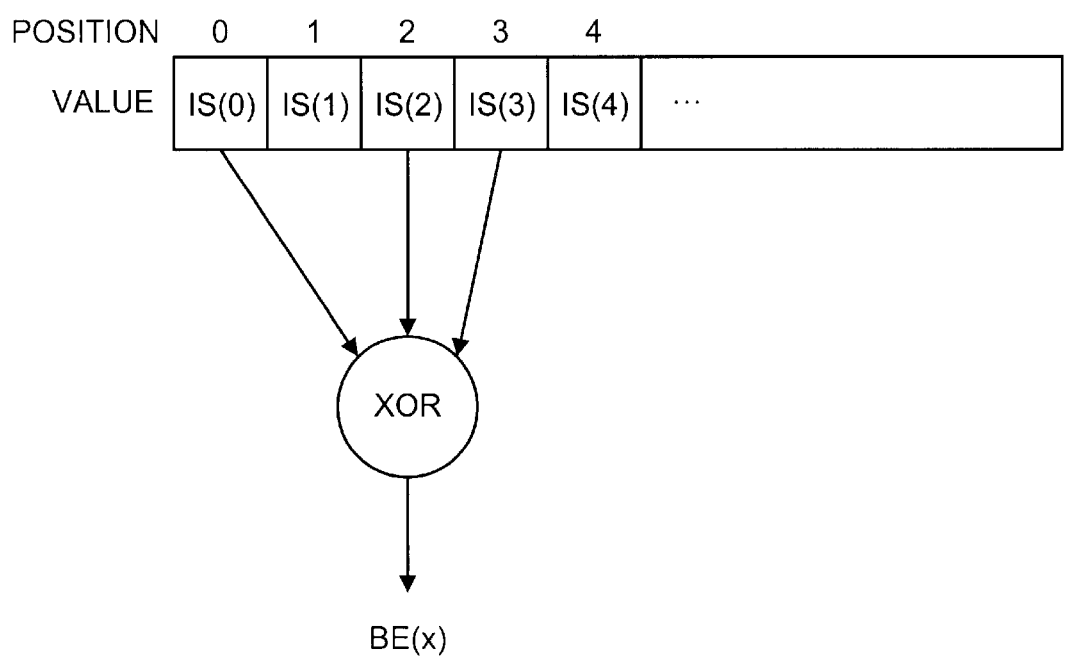
FIG. 5 is an illustration of how a basis element might be generated from a set of associated input symbols.

FIG. 5 shows an example in which the basis function BF(x) is an XOR function, the weight BW(x) of the basis element is 3, and the selected input symbols are at positions 0, 2, and 3, and have respective values IS(0), IS(2), and IS(3). Thus, the basis element is calculated as:

$$BE(x)=IS(0) \text{ XOR } IS(2) \text{ XOR } IS(3)$$

for that value of x.

A Basic Encoder

Figure 6:
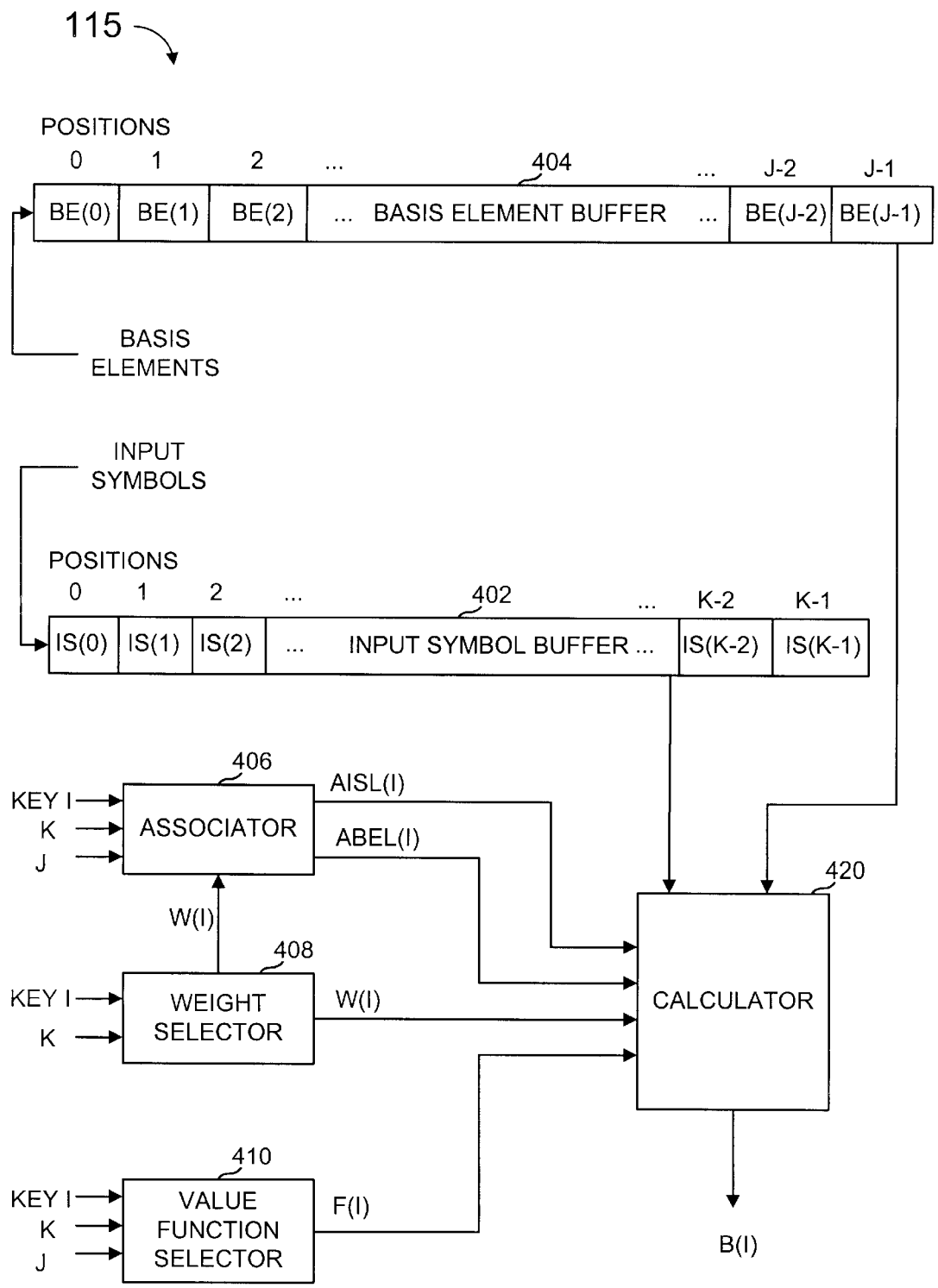
FIG. 6 is a block diagram of a basic encoder as might be used in the communication system shown in FIG. 1.
Figure 7A:
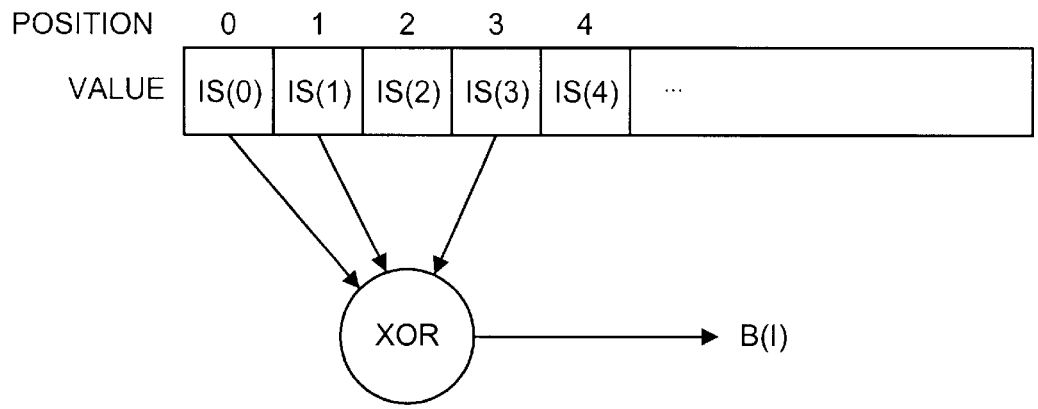
FIGS. 7A–7C are illustrations of how an output symbol might be generated from a set of associated input symbols, a set of associated basis elements, or a set of associated input symbols and basis elements.
Figure 7B:
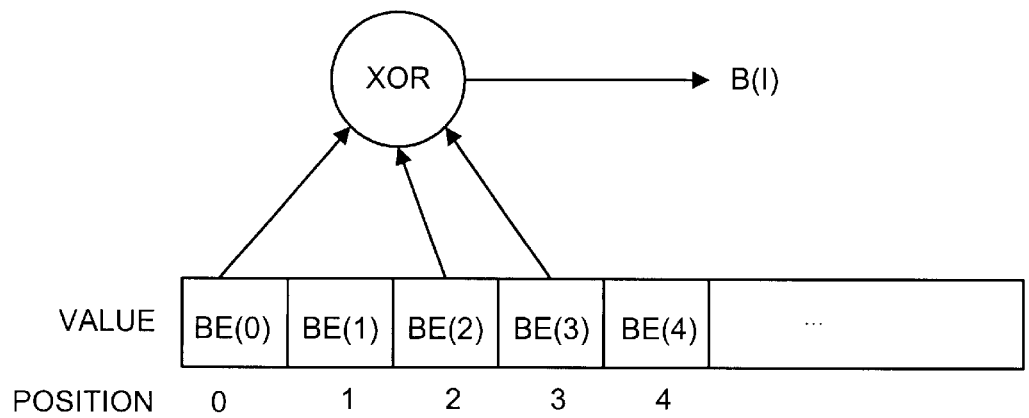
Figure 7C:
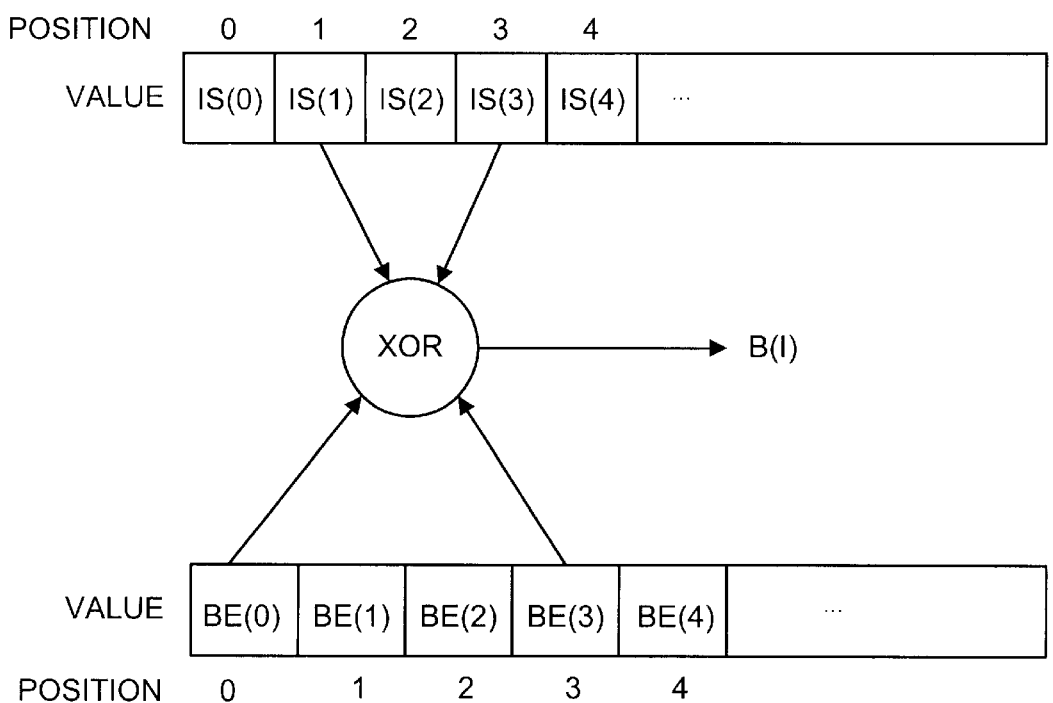

FIG. 6 is a simplified block diagram of one embodiment of the encoder 115 shown in FIG. 1. FIGS. 7A–7C are diagrams showing logical equivalents of some of the processing performed by the encoder 115 shown in FIG. 6. These diagrams are merely for illustrative purposes and are not intended to limit the scope of the claims herein.

The encoder 115 is provided with input symbols, basis elements, and a key for each output symbol it is to generate. As shown, the K input symbols are stored in an input symbol buffer 402. In one embodiment, the input symbol buffer 402 is the same as the input symbol buffer 202 shown in FIG. 4. Also, basis elements are stored in a basis element buffer 404. In one embodiment, the basis element buffer 404 is the same as the basis element buffer 212 shown in FIG. 4. For simplicity, there are assumed to be J basis elements which are precalculated by the basis element generator 117.

However, it is to be understood that the number J of basis elements need not be known and the basis elements themselves need not be precalculated. Rather, in some embodiments, the basis element generator 117 may generate basis elements as they are needed by the encoder 115. For example, each basis element may be computed only when the first output symbol with which it is associated is generated. This may be beneficial over pre-generating all of the basis elements, because, in some applications, all of the basis elements may not be used. For instance, if not enough output symbols are generated to require the use of all the basis elements, then the processing power used to generate the unused basis elements would be wasted.

Key I (provided by the key generator 120 shown in FIG. 1) is an input to associator 406, weight selector 408, and value function selector 410. The number of input symbols K is also provided to these three components, 406, 408, and 410. Additionally, the number J of basis elements is provided to the associator 406 and the function selector 410. The output of the weight selector 408 is provided to the associator 406. A calculator 420 receives outputs from the associator 406, the value function selector 410, the input symbol buffer 402, and the basis element buffer 404, and has an output for output symbol values. In some embodiments, the calculator 420 may also receive outputs from the weight selector 408.

In operation, the weight selector 408 generates an integer W(I) using the key I and the number of input symbols K. The weight selector 408 may generate the integer W(I), for example, in any of the ways disclosed in Luby I and Luby II. The associator 406 receives the key I, values K and J, and the weight W(I), and generates a list AISL(I) of direct associated input symbols and a list ABEL(I) of associated basis elements. The lists AISL(I) and ABEL(I) are determined such that the resulting output symbol calculated using the input symbols and/or basis elements identified in the lists AISL(I) and ABEL(I) has a weight that is the same, or substantially the same, as the weight W(I). The generation of the lists AISL(I) and ABEL(I) will be described subsequently in more detail with respect to specific embodiments.

If used, value function selector 410 determines a value function F(I) from I, K, and J. In some embodiments, the value function F(I) is the same value F for all I. In these embodiments, value function selector 410 is not needed, and calculator 420 can be configured with the value function F.

One property of a suitable value function is that it would allow the value of a direct associated input symbol used to calculate the output symbol B(I) to be calculated from the output symbol B(I) and from the values for the other W(I)−1 direct and indirect associated input symbols used to calculate the output symbol B(I). Another property of both a suitable value function F(I) and a suitable basis function BF(x) is that, with an output symbol B(I) calculated using at least one basis element BE(x), the function would allow the value of an indirect associated input symbol in the basis element BE(x) to be determined from the output symbol B(I), from the values for the other input symbols in BE(x), and from other direct and indirect associated input symbols used to calculate B(I).

In one embodiment, the value function F(I) is chosen to be XOR for all I, and the basis function BF(x) is also chosen to be XOR for all x. However, it is to be understood that other suitable basis functions may also be used. For example, systems and methods similar to those described Luby II could be used. Luby II describes, for instance, a system in which a group of output symbols are generated using a Reed-Solomon value function. Moreover, Luby II describes other value functions that may also be used, including methods based on polynomials over finite fields, methods based on linear systems of equations, methods based on Cauchy matrices over finite fields, and other MDS codes (of which Reed-Solomon codes are examples).

Next, the calculator 420 receives the lists AISL(I) and ABEL(I) and the value function F(I). The calculator 420 accesses the input buffer 402 to obtain the input symbols, if any, referenced by AISL(I) and the basis elements, if any, referenced by ABEL(I). Then, the calculator generates the output symbol B(I) from the input symbols, if any, and the basis elements, if any, using the function F(I) or a preselected value function F.

Next, the encoder 115 outputs B(I). In effect, encoder 115 performs one of the actions illustrated in FIGS. 7A–7C, namely to generate an output symbol value B(I) as some value function of selected input symbols, selected basis elements, or selected input symbols and selected basis elements. In the examples shown, the value function is XOR, the weight of the basis elements are all ten, and none of the basis elements are calculated with a common input symbol. In FIG. 7A, the weight of the output symbol is three, there are no associated basis elements, and the direct associated input symbols are IS(0), IS(1), and IS(3). Thus, the output symbol is calculated as:

B(I)=IS(0) XOR IS(1) XOR IS(3)

for that value of I.

In FIG. 7B, the weight of the output symbol is thirty, there are no direct associated input symbols, and the associated basis elements are BE(0), BE(2), and BE(3). Thus, the output symbol is calculated as:

B(I)=BE(0) XOR BE(2) XOR BE(3)

for that value of I.

In FIG. 7C, the direct associated input symbols are IS(1) and IS(3), and the associated basis elements are BE(0) and BE(3). The weight of the output symbol is either eighteen (if both IS(1) and IS(3) occur in either of BE(0) or BE(3)), twenty (if exactly one of IS(1) and IS(3) occur in either of BE(0) or BE(3)), or twenty-two (if neither IS(1) and IS(3) occur in either of BE(0) or BE(3)). Thus, the output symbol is calculated as:

B(I)=IS(1) XOR IS(3) XOR BE(0) XOR BE(3)

for that value of I.

A Basic Decoder

Figure 8:
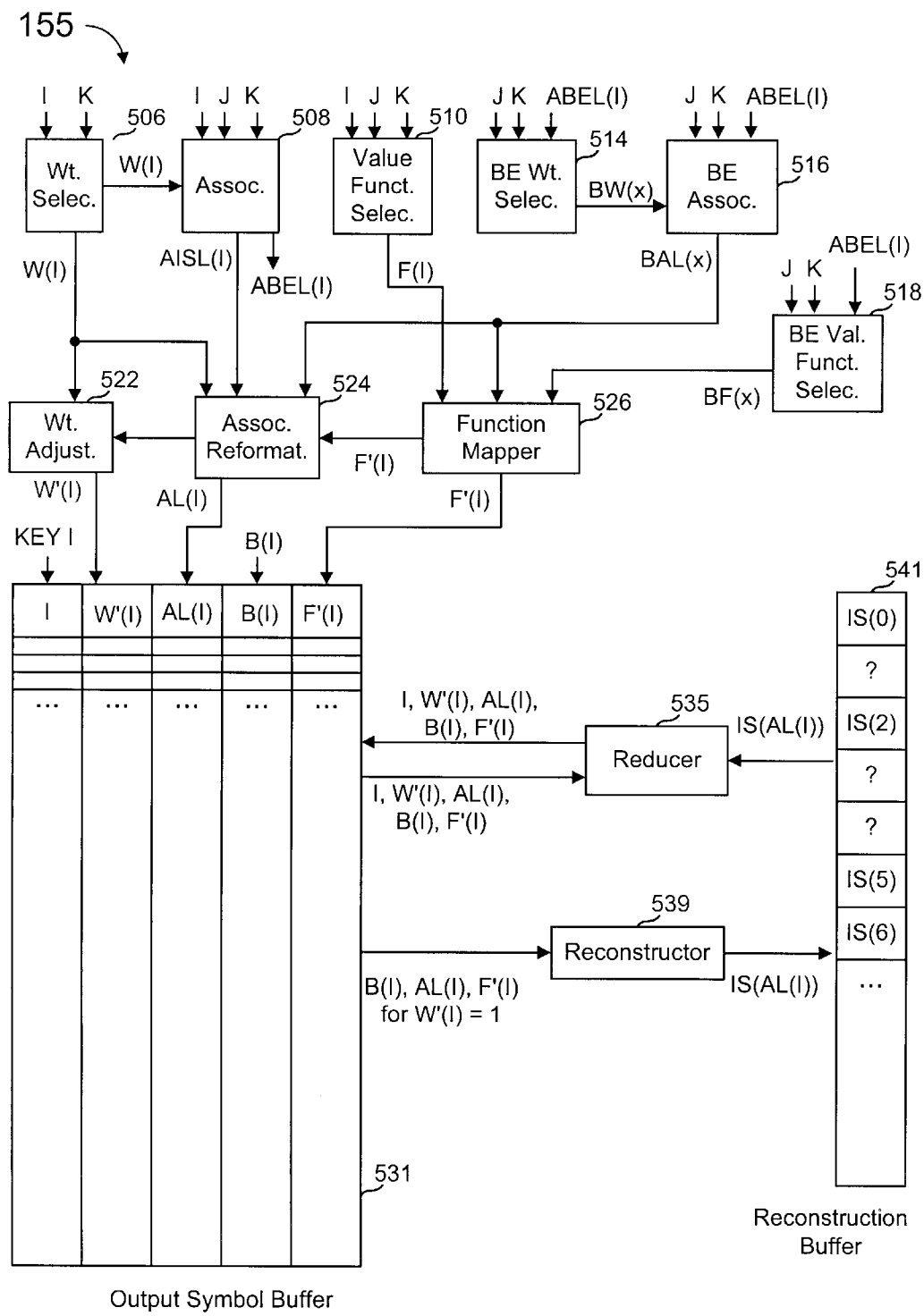
FIG. 8 is a block diagram of a basic decoder as might be used in the communication system shown in FIG. 1.

FIG. 8 is a simplified block diagram of one embodiment of the decoder 155 shown in FIG. 1. This diagram is merely for illustrative purposes and is not intended to limit the scope of the claims herein. The decoder 155 is similar to the basic decoder described in Luby I. The decoder 155 includes many parts similar to those in the encoder 115 shown in FIG. 6 and the basis element generator 117 shown in FIG. 4. For instance, decoder 155 includes a weight selector 506, an associator 508, a value function selector 510 similar to weight selector 406, associator 408, and value function selector 410, respectively, shown in FIG. 6. Also, decoder 155 includes a basis element weight selector 514, a basis element associator 516, a basis element value function selector 518, similar to basis element weight selector 204, basis element associator 206, and basis element value function selector 208, respectively, shown in FIG. 4. Decoder 155 additionally includes a weight adjuster 522, an associate reformatter 524, a value function mapper 526, an output symbol buffer 531, a reducer 535, a reconstructor 539, and a reconstruction buffer 541. Several entries of the reconstruction buffer 541 are shown, with some input symbols reconstructed and with others as yet unknown. For example, in FIG. 8, the input symbols at positions 0, 2, 5, and 6 have been recovered and the input symbols at positions 1, 3, and 4 have yet to be recovered (and are therefore unknown).

In operation, for each received output symbol with key I and value B(I), decoder 155 does the following. Key I is provided to weight selector 506, associator 508, and function selector 510. Using K and I, weight selector 506 determines weight W(I). Using J, K, key I, and weight W(I), associator 508 produces the list AISL(I) of direct associated input symbols and the list ABEL(I) of basis elements associated with the output symbol. Using I, J and K, value function selector 510 selects a value function F(I). Weight selector 506, associator 508, and function selector 510 perform an operation for decoder 155 similar to the operation performed by weight selector 406, associator 408, and function selector 410 for encoder 115. In particular, the weight W(I), the lists AISL(I) and ABEL(I), and the value function F(I) produced in FIG. 8 are the same for the same key I as for the corresponding parts shown in FIG. 6. If K and J vary over time or from input file to input file, they can be communicated from the encoder to the decoder in any conventional manner, such as including them in a message header.

Next, J, K, and the list ABEL(I) of basis elements are provided to the basis element weight selector 514, the basis element associator 516, and the basis element value function selector 518. Using J, K and the list ABEL(I), the basis element weight selector 514 generates a weight BW(x) for each of the basis elements identified in the list ABEL(I). Using J, K, ABEL(I), and the weights BW(x), the basis element associator 516 generates, for each basis element identified in the list ABEL(I), a list BAL(x) of input symbols associated with the basis element. Using J, K, and ABEL(I), the basis element value function selector 518 selects, for each basis element identified in the list ABEL(I), a value function BF(x). Basis element weight selector 514, the basis element associator 516, and the basis element value function selector 518 perform an operation for decoder 155 similar to the operation performed by basis element weight selector 204, basis element associator 206, and basis element value function selector 208 for basis element generator 117. In particular, the weights BW(x), the lists BAL(x), and the basis element value functions BF(x) produced in FIG. 8 are the same for the same indices x in ABEL(I) as for the corresponding parts shown in FIG. 4. In one embodiment, the lists BAL(x) are stored as rows in a table of associates for basis elements in basis element associator 516, and basis element BE(x) indexes into the row corresponding to x of the table.

Then, the value function F(I), and the basis value functions BF(x) are provided to value function mapper 526. Value function mapper 526 maps, if needed, the value function F(I), a function of input symbols and/or basis elements, into a function F'(I) of only input symbols. For example, say value function F is a function of input symbols IS(0) and IS(3), and basis element BE(5). And, say basis element value function BF for BE(5) is a function of input symbols IS(2) and IS(4). Thus, function F can be written as F(IS(0), IS(3), BF(IS(2), IS(4))). Value function mapper 526 maps the function F into a function F'(IS(0), IS(3), IS(2), IS(4)). If, for a particular output symbol B(I), the list ABEL(I) is empty (i.e., no basis elements were used to generate B(I)), no mapping is necessary, and F'(I) is simply F(I). If the value function F(I) is F for all I, and if the basis value function BF(x) is BF for all x, then function selector 510 and basis element value function selector 518 are not needed. Additionally, if F and BF are the same function then, for at least some functions (e.g., XOR), function mapper 526 is also not needed.

Then, the list AISL(I) of direct associated input symbols, and the lists BAL(x) of input symbols (i.e., the indirect associated input symbols) are provided to an associate reformatter 524. W(I) may also be provided to the associate reformatter 524. The associate reformatter 524 generates a list AL(I) of input symbols associated directly and indirectly with the output symbol B(I), including those identified in the list AISL(I) and those identified in the lists BAL(x). The associate reformatter 524 may also identify direct or indirect associated input symbols that have been used more than once (e.g., are associates in multiple basis elements). If the associate reformatter 524 does identify an input symbol used more than once, the associate reformatter 524 may signal the weight adjuster 522 to adjust the weight W(I) of the output symbol accordingly. Additionally, the associate reformatter 524 receives the value function F'(I) so that it may identify when an input symbol used more than once should be removed from the list AL(I). For example, with the value function XOR, input symbols that are used an even number of times may be deleted from the list AL(I) because a value XOR-ed with itself an even number of times is always zero. The weight adjuster 522 receives the weight W(I) and a signal from the associate reformatter 524, and adjusts the weight W(I), if needed, to generate a weight W'(I).

Then, I, W'(I), AL(I), B(I), and F'(I) are stored in a row of output symbol buffer 531. Reconstructor 539 scans output symbol buffer 531 looking for output symbols stored there that have weight one, i.e., W'(I)=1 and AL(I) lists the position of just one associate. Those symbols are referred to herein as members of a "decodable set." For value functions with the properties described above, output symbols of weight one are in the decodable set because the value of an input symbol can be determined from that output symbol and other information available to the decoder if needed. Of course, if a value function were used that would allow input symbols to be decoded under a condition other than having a weight one, that condition would be used to determine whether an output symbol is in the decodable set. For example, Luby II describes systems in which groups of output symbols are generated using value functions such as Reed-Solomon codes, methods based on polynomials over finite fields, methods based on linear systems of equations, methods based on Cauchy matrices over finite fields, and other MDS codes (of which Reed-Solomon codes are examples). And, Luby II describes conditions under which a group of output symbols is in a decodable set. For instance, if a Reed-Solomon value function is used, groups of output symbols whose weight is at most their group size are considered to be in the decodable set. For clarity, the examples described here assume that the decodable set is those output symbols with weight one, and extensions of these examples to other value function decodable conditions should be apparent from this description.

When reconstructor 539 finds an output symbol that is in the decodable set, the output symbol's value B(I) and optionally the value function F'(I) is used to reconstruct the input symbol listed in AL(I) and the reconstructed input symbol is placed into reconstruction buffer 541 at the appropriate position for that input symbol. If the indicated input symbol had already been reconstructed, the reconstructor 539 could drop the newly reconstructed input symbol, overwrite the existing reconstructed input symbol, or compare the two and issue an error if they differ. Where the value function is an XOR of all the associates, the input symbol value is simply the output symbol's value. Reconstructor 539 thus reconstructs input symbols, but only from output symbols in the decodable set. Once an output symbol from the decodable set is used to reconstruct an input symbol it can be deleted to save space in output symbol buffer 531. Deleting the "used up" output symbol also ensures that reconstructor 539 does not continually revisit that output symbol.

Initially, reconstructor 539 waits until at least one output symbol is received that is a member of the decodable set. Once that one output symbol is used, the decodable set would be empty again, except for the fact that some other output symbol might be a function of only that one reconstructed input symbol and one other input symbol. Thus, reconstructing one input symbol from a member of the decodable set might cause other output symbols to be added to the decodable set. The process of reduction of output symbols to add them to the decodable set is performed by reducer 535.

Reducer 535 scans output symbol buffer 531 and reconstruction buffer 541 to find output symbols that have lists AL(I) that list positions of input symbols that have been recovered. When reducer 535 finds such a "reducible" output symbol with key I, reducer 535 obtains the value IS(R) of a recovered input symbol at position R and modifies B(I), W'(I) and AL(I) as follows:

B(I) is reset to B(I) XOR IS(R)

W'(I) is reset to W'(I)−1

AL(I) is reset to AL(I) excluding R.

In the equations above, it is assumed that the value function was an XOR of all the associates' values. Note that XOR is its own inverse—if that were not the case and another value function was used originally to compute the output symbol, then the inverse of that value function would be used here by reducer 535. As should be apparent, if the values for more than one associate are known, the equivalent of the above equations can be calculated to make B(I) dependent only on any unknown associate values (and adjust W'(I) and AL(I) accordingly).

The action of reducer 535 reduces the weights of output symbols in output symbol buffer 531. When an output symbol's weight is reduced to one (or another decodable condition occurs for other value functions), then that output symbol becomes a member of the decodable set, which can then be acted upon by reconstructor 539. In practice, once a sufficient number of output symbols are received, reducer 535 and reconstructor 539 create a chain reaction decoding, with reconstructor 520 decoding the decodable set to recover more input symbols, reducer 535 using those freshly recovered input symbols to reduce more output symbols so they are added to the decodable set, and so on, until all input symbols from the input file are recovered.

It is to be understood that the decoder 155 shown in FIG. 8 is merely one embodiment of a decoder according to the invention. One skilled in the art will recognize many variations, modifications, and alternatives. For example, the decoder 155 could be modified to additionally reconstruct basis elements from recovered input symbols, and maintain a buffer or table of recovered basis elements. The decoder 155 could then utilize the reconstructed basis elements in recovering input symbols. For example, if the decoder 155 receives an output symbol whose associates include a reconstructed basis element, the value of the reconstructed basis element could be used to modify B(I), W(I), ABEL(I), and F(I), in a manner similar to that as described with respect to the reducer 535, rather than mapping the function F(I) to a function of the recovered basis element's input symbol associates.

The decoder 155 shown in FIG. 8 reconstructs input symbols in a straightforward manner, without much consideration to memory storage, computation cycles or transmission time. Where the decoder memory, decoding time or transmission time (which constrains the number of output symbols that are received) are limited, the decoder can be optimized to better use those limited resources.

A More Efficient Decoder

Figure 9:
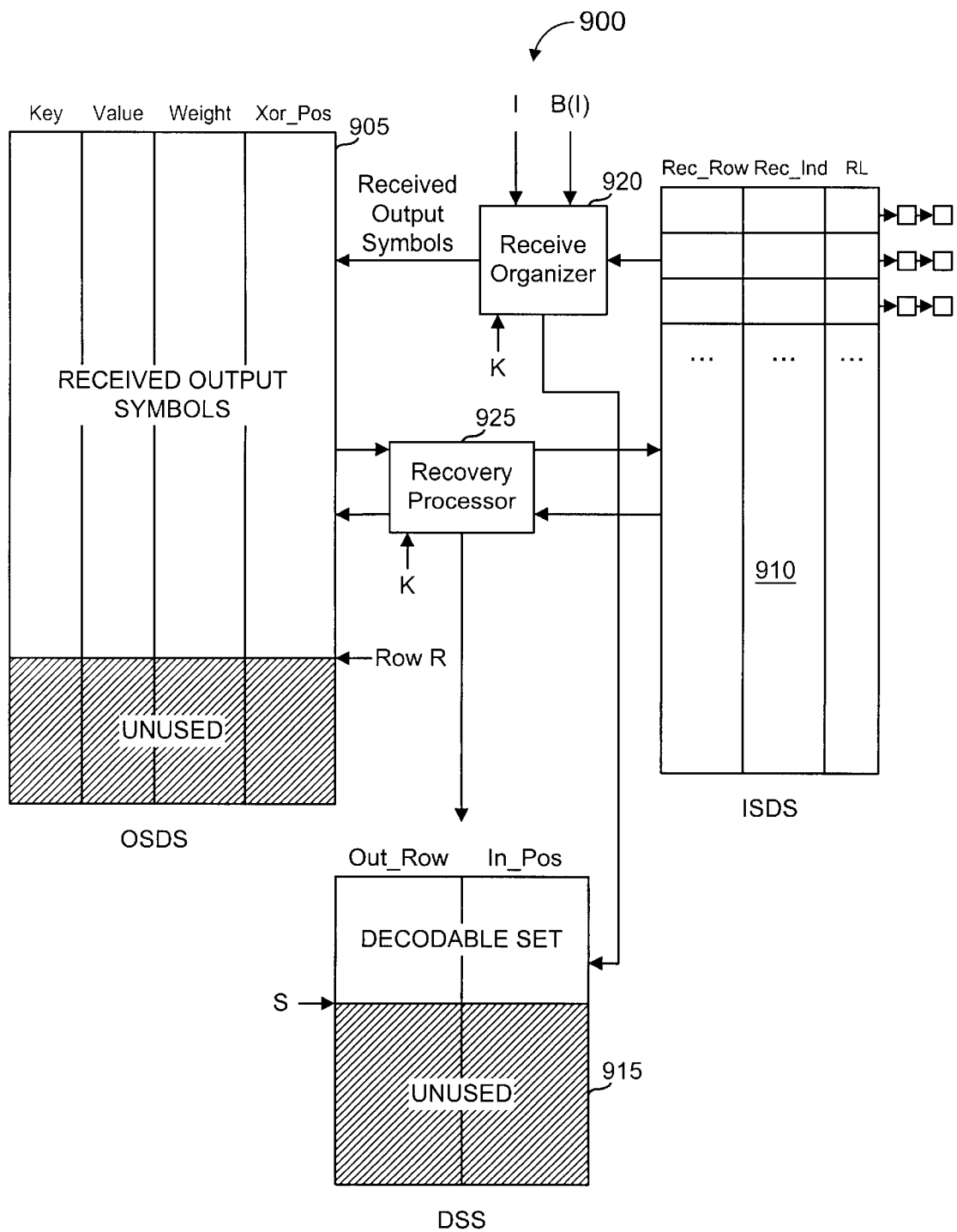
FIG. 9 is a block diagram of an alternative decoder.

FIG. 9 shows one embodiment of a more efficient implementation of a decoder in detail. In particular, FIG. 9 illustrates a decoder 900 that may be substituted for the decoder 155 of FIGS. 1 and 8. This diagram is merely for illustrative purposes and is not intended to limit the scope of the claims herein. Here, the value function F(I) and the basis value function BF(x) are assumed to be XOR. Similar implementations apply with respect to value functions other than XOR. Decoder 900 comprises output symbol data structure 905 (hereafter referred to as OSDS 905), input symbol data structure 910 (hereafter referred to as ISDS 910), decodable set stack 915 (hereafter referred to as DSS 915), receive organizer 920, and recovery processor 925.

OSDS 905 is a table that stores information about output symbols. A variable R keeps track of the number of output symbols that have been received. In OSDS 905, row R of OSDS 905 stores information about the R-th output symbol that is received. and it is initialized to zero. OSDS 905 stores the fields KEY, VALUE, WEIGHT and XOR_POS for each row, with the fields shown organized in columns. The KEY field stores the key of the output symbol. The VALUE field stores the output symbol value, which is updated during processing. All output symbols that are eventually used to recover an input symbol eventually have their VALUE modified to the recovered input symbol value. The WEIGHT field stores the initial weight of the output symbol. In one embodiment, the WEIGHT field stores the output of the weight adjuster 506 of FIG. 8. The WEIGHT of an output symbol is reduced over time until it becomes one and then can be used to recover an input symbol. The XOR_POS field initially stores the XOR of all the positions of the input symbol associates of the output symbol. When the WEIGHT of an output symbol becomes one, the XOR_POS of the output symbol becomes the position of the one remaining input symbol associate.

ISDS 910 is a table that stores information about input symbols, where row P stores information about the input symbol at position P. For each row, ISDS 910 includes storage for a REC_ROW field, which eventually becomes the row number in OSDS 905 of the output symbol that is used to recover the input symbol, a REC_IND field, which is initialized to all values "no" and indicates whether or not input symbols have been recovered, and an RL field. When an input symbol is recovered, the REC_IND of the input symbol is changed to "yes". The RL column is initialized to all "empty list" values. As output symbols are received, the row number in OSDS 905 of the output symbol is added to the RL list for each of the input symbols that are associates of the output symbol.

DSS 915 is a stack that stores information about the decodable set. A variable S keeps track of the size of the decodable set, and it is initialized to zero. In DSS 915, column OUT_ROW stores row numbers in OSDS 905 of output symbols, and column IN_POS stores the positions in ISDS 910 of the input symbols that can be recovered.

Figure 10:
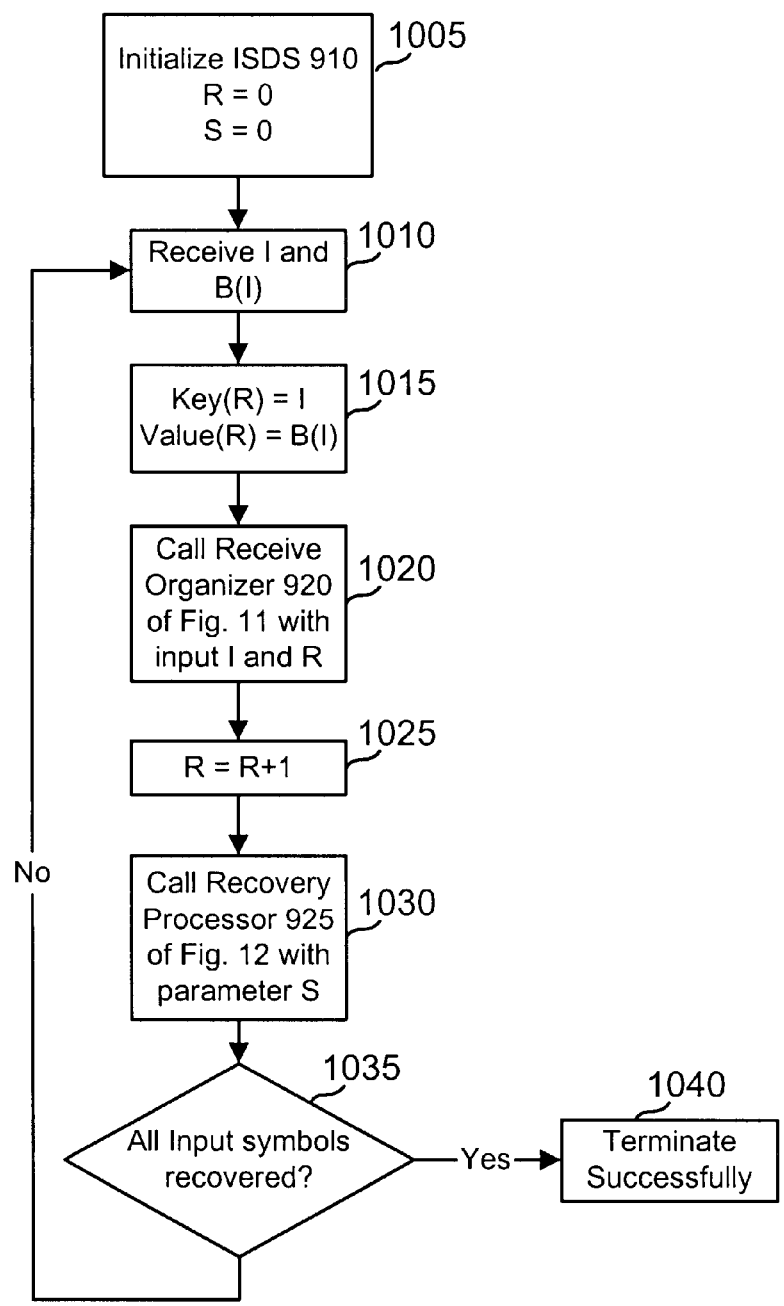
FIG. 10 is a flow diagram of a process that might be used by a decoder, such as the decoder shown in FIG. 9, to recover input symbols from a set of output symbols.
Figure 11:
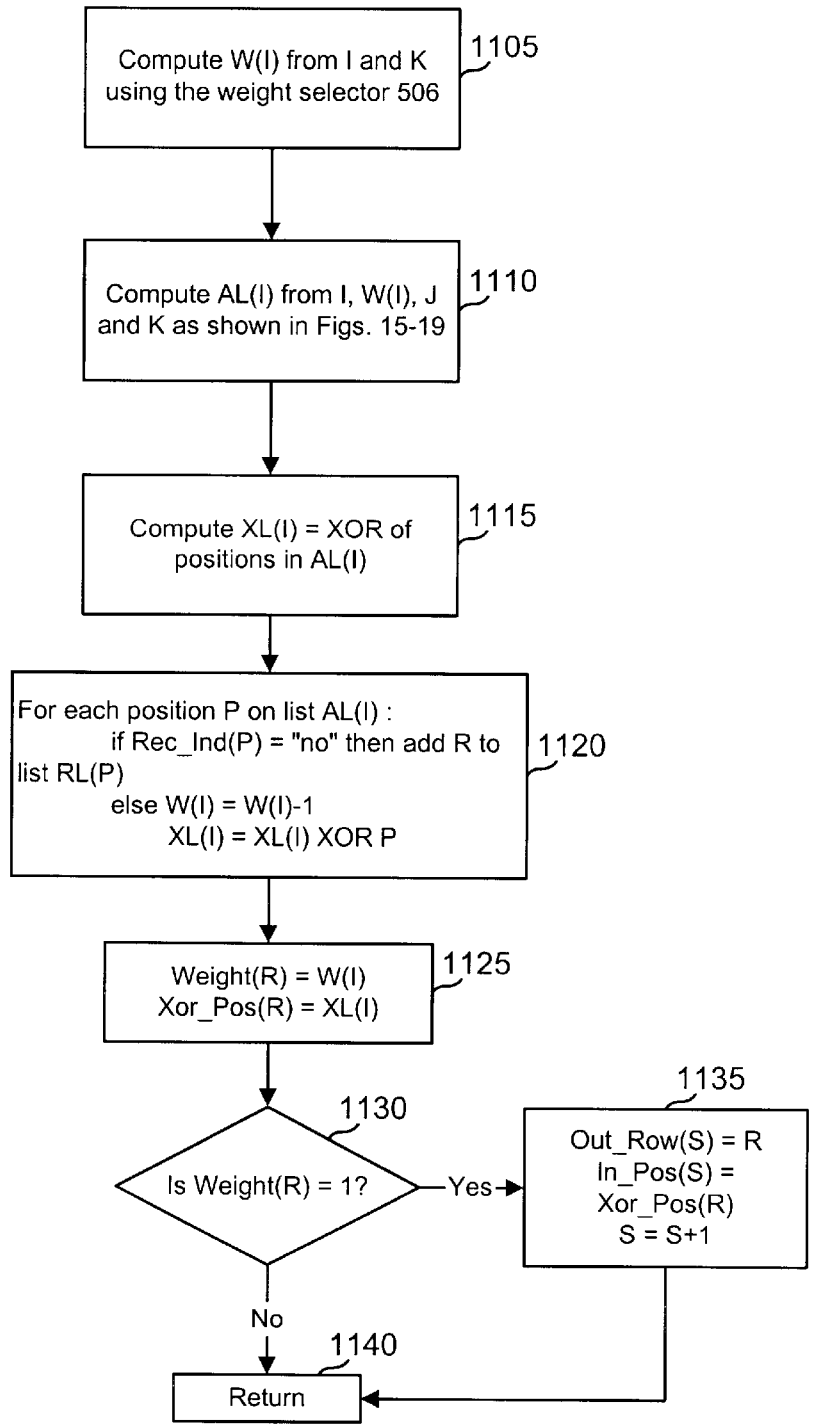
FIG. 11 is a flow diagram of a process that might be used by a receive organizer, such as the receive organizer shown in FIG. 9, to organize received output symbols.
Figure 12:
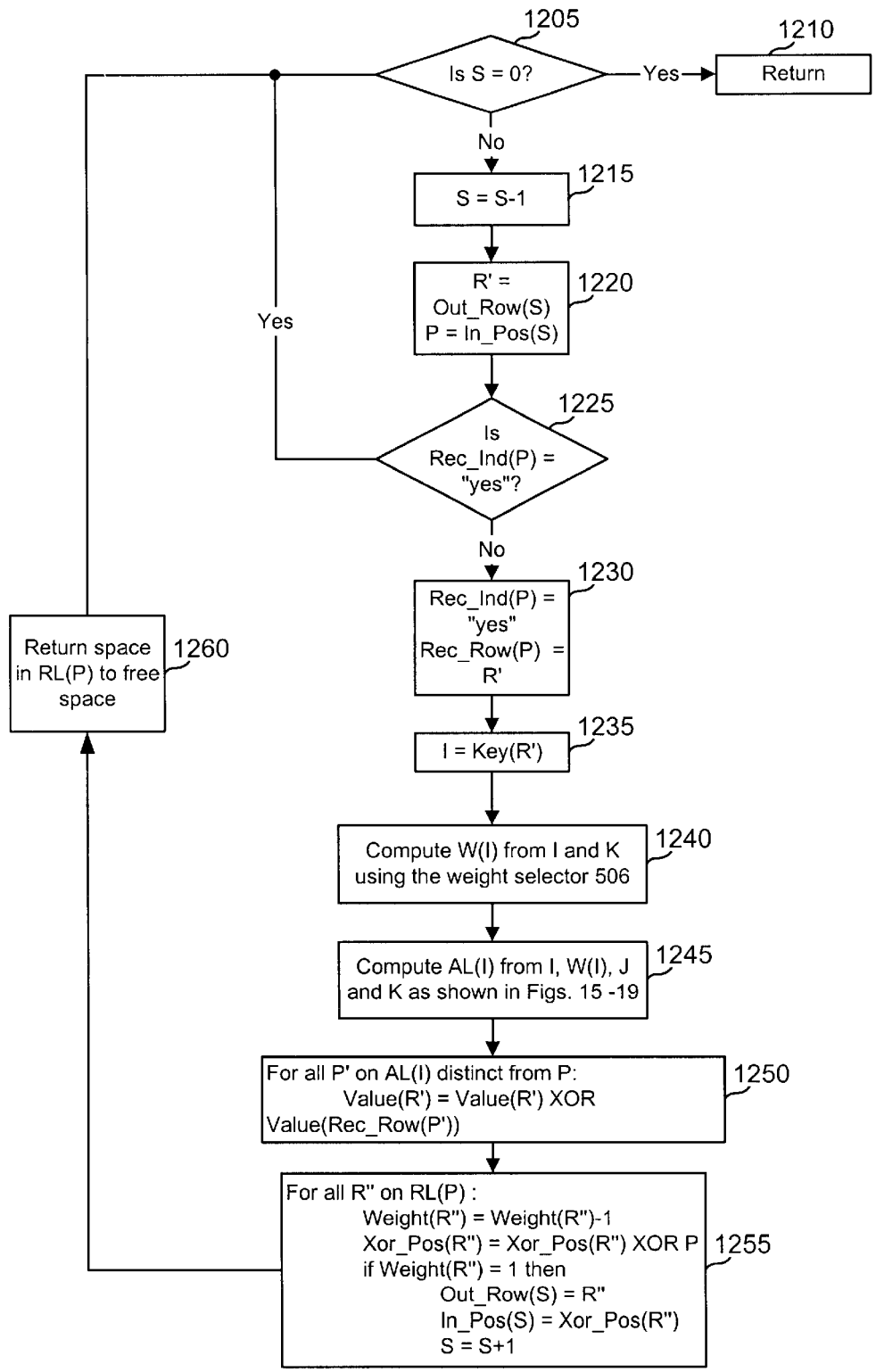
FIG. 12 is a flow diagram of a process that might be used by a recovery processor, such as the recovery processor shown in FIG. 9, to process received output symbols.

In one embodiment, decoder 900 operates as follows and as shown in the flow diagram of FIG. 10 with the corresponding steps of FIG. 10 indicated parenthetically in the description of the process. This diagram is merely for illustrative purposes and is not intended to limit the scope of the claims herein. First, ISDS 910 is initialized as described above, and both R and S are initialized to zero (1005). When a new output symbol is received (1010), i.e., the key I and the output symbol value B(I), KEY(R) is set to I and VALUE(R) is set to B(I) in OSDS 905 (1015). Receive organizer 920 is then called to process the received output symbol with key I stored in row R of OSDS 905 (1020). This includes adding information to OSDS 905 and DSS 915 appropriately using information stored in ISDS 910, as shown in the flowchart of FIG. 11. Then, R is incremented by one (1025) to cause the next output symbol to be stored in the next row of OSDS 905. Recovery processor 925 is then called to process output symbols in the decodable set and to add new output symbols to the decodable set (1030). This includes adding to and deleting from the decodable set stored in DSS 915, using and modifying portions of ISDS 910 and OSDS 905 appropriately, as shown in the flowcharts of FIG. 12 and/or FIG. 13. Decoder 900 keeps track of the number of input symbols that have been recovered, and when this number reaches K, i.e., all input symbols have been recovered, decoder 900 terminates successfully (1040), otherwise it returns to step 1010 to receive the next output symbol, as shown in 1035.

A flow diagram that describes the operation of receive organizer 920 is shown in FIG. 11, which refers to FIGS. 15–18. The diagram of FIG. 11 is merely for illustrative purposes and is not intended to limit the scope of the claims herein. When an output symbol with value B(I) and key I arrives, receive organizer 920 performs the following operations, referring to FIG. 11. Weight W(I) is computed from I and K (1105) and list AL(I) of positions of associates is computed from I, W(I), J and K (1110). FIGS. 15–18 illustrate in more detail a computation of AL(I).

Referring again to FIG. 11, the value of XL(I) is computed as the XOR of all of the positions in AL(I) (1115). Then, for each position P on list AL(I), if input symbol P is not recovered, i.e., if REC_IND(P)="no" in ISDS 910, then R is added to list RL(P) in ISDS 910, otherwise if input symbol P is recovered, i.e., if REC_IND(P)="yes" in ISDS 910, then W(I) is decremented by one and XL(I) is reset to XL(I) XOR P (1120). Then, XOR_POS(R) is set to XL(I) and WEIGHT(R) is set to W(I) in OSDS 905 (1125). WEIGHT (R) is then compared to one (1130). If WEIGHT(R) is equal to one, then the output symbol is added to the decodable set, i.e., OUT_ROW(S) is set to R and IN_POS(S) is set to XOR_POS(R) in DSS 915 and the value of S is incremented by one (1135). Finally, receive organizer 920 returns (1140).

FIG. 12 is a flow diagram illustrating one embodiment of an operation of recovery processor 925, and refers to FIGS. 15–18. The diagram of FIG. 12 is merely for illustrative purposes and is not intended to limit the scope of the claims herein. In that operation, recovery processor 925 first checks to see if the decodable set is empty, i.e., if S=0, and if so it immediately returns (1205, 1210). If the decodable set is not empty, then S is decremented by one (1215) and the row number R' of the output symbol and the position P of the associated input symbol is loaded from DSS 915 (1220). If the input symbol at position P has already been recovered, i.e., if REC_IND(P)="yes," (1225), then recovery processor 925 stops processing this element of the decodable set and continues on to process the next. Otherwise, the output symbol stored at row number R' in OSDS 905 is used to recover the input symbol at position P in ISDS 910, and this is indicated by setting REC_IND(P) to "yes" and REC_ROW(P) to R' in ISDS 910 (1230). Then, the original key of the output symbol, KEY(R') from OSDS 905, is loaded into I (1235) in order to compute the original weight W(I) and the original list of associates AL(I) of the key (1240, 1245).

Referring still to FIG. 12, the recovered value of the input symbol at position P is computed as the XOR of the output symbol and all associates of the output symbol excluding the input symbol. This is computed by considering all positions P' on AL(I) distinct from P. Note that REC_ROW(P') in ISDS 910 stores the row number of the recovered value for the input symbol in position P', and that VALUE(REC_ROW(P')) in OSDS 905 is this recovered value. This computation is shown in 1250 of FIG. 12, and the recovered value for the input symbol in position P is stored in VALUE (R')=VALUE(REC_ROW(P)) at the end of this computation.

Figure 13:
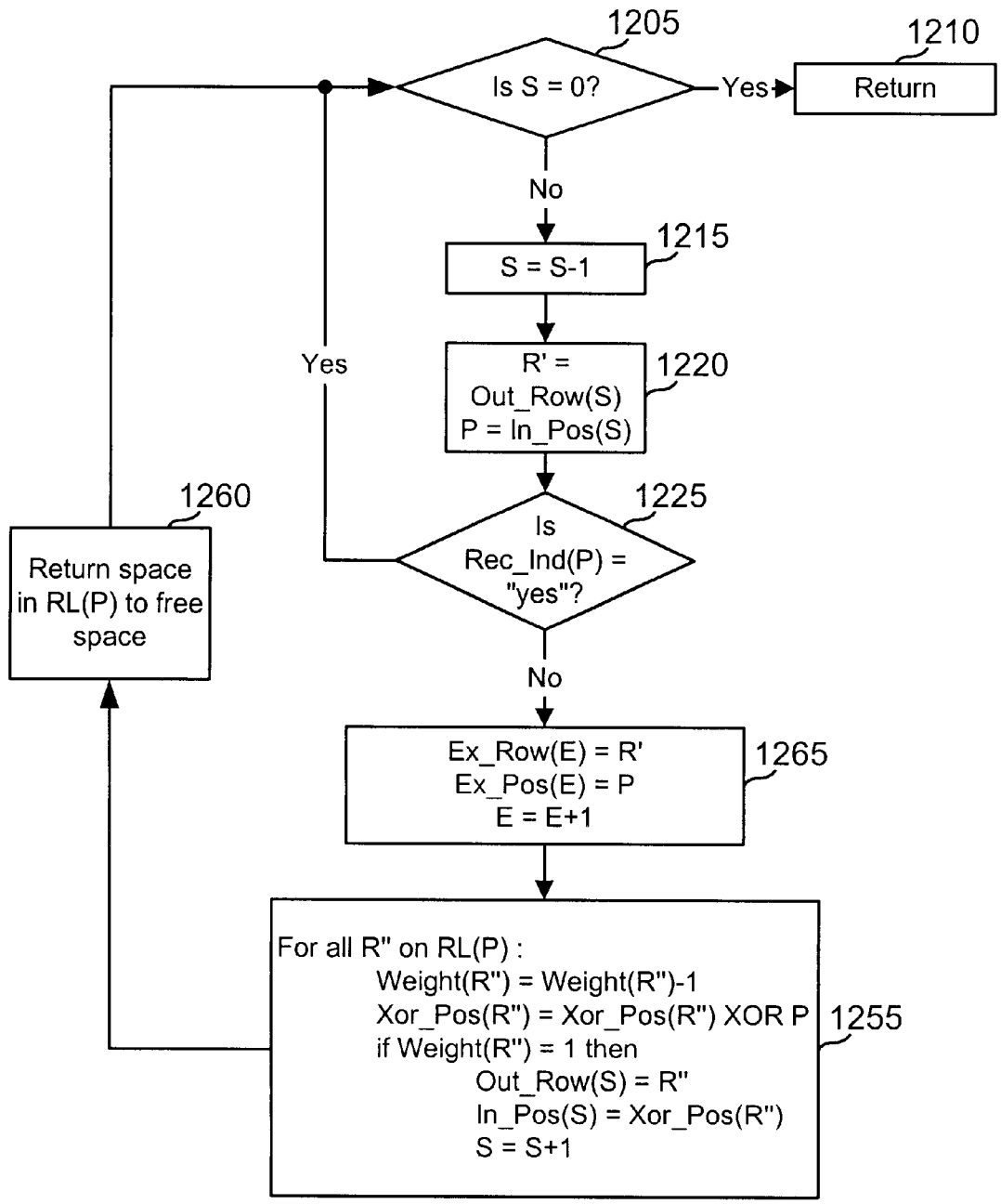
FIGS. 13 and 14 are flow diagrams illustrating a variation of the process of FIG. 12, with FIG. 13 showing steps performed in the recovery process including deferred processing, and FIG. 14 showing the deferred processing.
Figure 14:
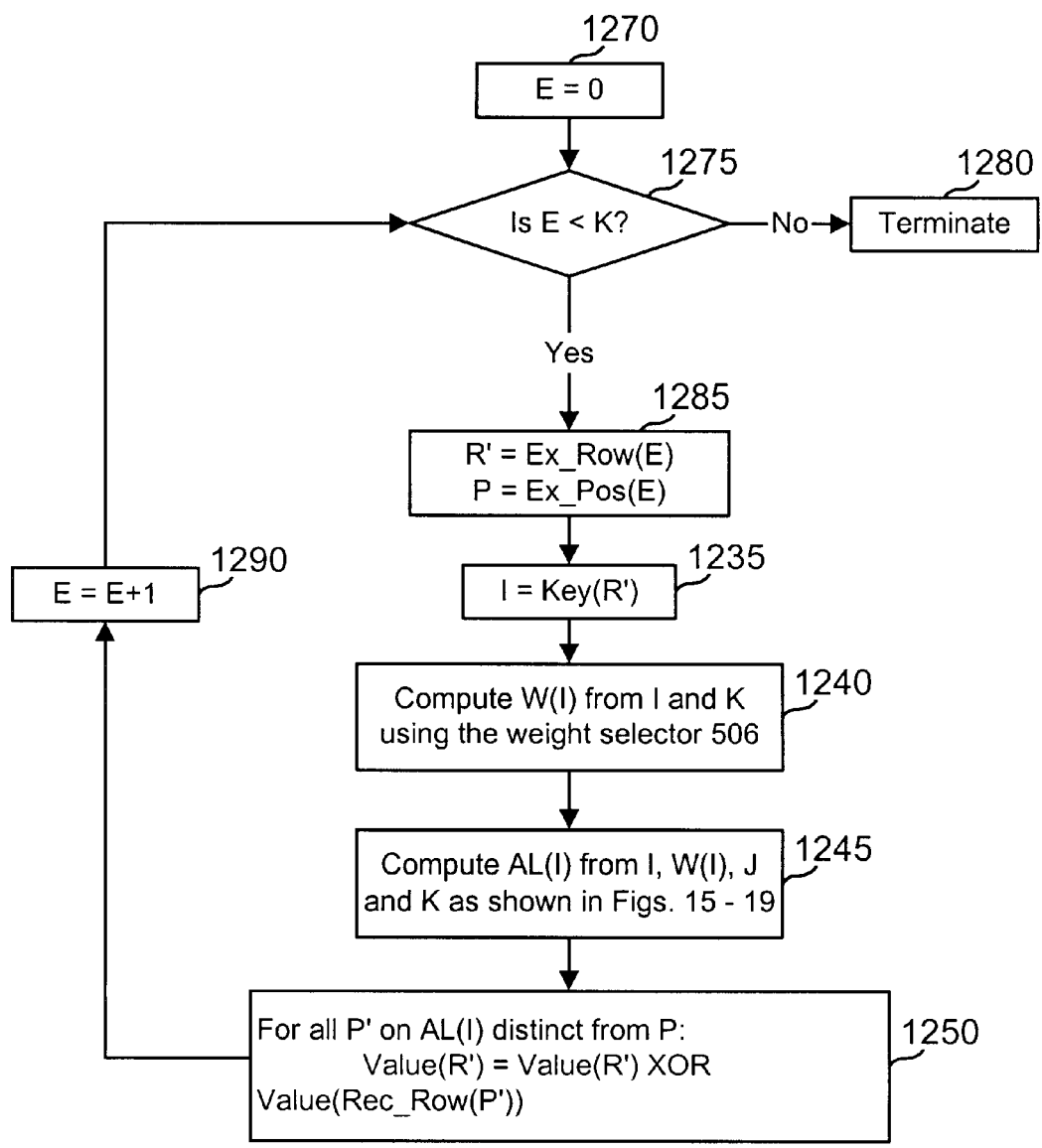

FIG. 13 is a flow diagram illustrating another embodiment of an operation of recovery processor 925 according to the invention. This diagram is merely for illustrative purposes and is not intended to limit the scope of the claims herein. FIG. 13 illustrates a variation of the process described with respect to FIG. 12. In particular, instead of performing steps 1230, 1235, 1240, 1245 and 1250 in FIG. 12 for each output symbol as it is processed, the values of R' and P can be stored in an execution schedule for later processing. An example of deferred execution processing is shown in FIG. 14. In this variation, the flow shown in FIG. 10 is modified by initializing E to zero in step 1005. The deferred processing of the execution schedule can occur after the decoder determines that the received symbols are enough to decode the entire file, e.g. at step 1040 in FIG. 10, after it is known that all input symbols are recoverable. In some cases, especially where the input symbols are large, the execution of the schedule could be deferred until the input file, or portions thereof, are needed at the receiver.

In either variation, (i.e., in either of the embodiments illustrated FIG. 12 or FIG. 13) at step 1255 the output symbols that still have input symbol P as an associate are modified to reflect that the input symbol has been recovered. The row numbers of these output symbols in OSDS 905 are stored in RL(P). For each row number R" in RL(P), WEIGHT(R") is decremented by one and P is XORed into XOR_POS(R") to reflect the removal of the input symbol in position P as an associate of the output symbol in row R" of OSDS 905. If this modification causes the output symbol in row R" of OSDS 905 to become weight one, i.e., WEIGHT (R")=1, then this output symbol is added to the decodable set by setting OUT_ROW(S) to R", IN_POS(S) to XOR_POS (R"), and incrementing S by one. Finally, the space used for storing row numbers of output symbols on list RL(P) is returned to free space (1260), and processing continues at step 1205.

An Associator, Basis Element Associator and Associate Reformatter Implementation The mapping from an output symbol key to direct associated input symbols and basis elements (i.e., the determination of the weights W(I) and BW(x), and the lists AISL(I) and ABEL(I) of positions of direct associates and basis elements for a key I), the mapping from the list ABEL(I) to the lists BAL(x), and the mapping from the lists AISL(I) and BAL(x) to the list AL(I) can take a variety of forms. W(I) should be chosen to be the same value by both the encoder and decoder for the same key I (in the sender and the recipient, respectively). Similarly, AISL(I) and ABEL(I) should be chosen to contain the same respective lists of input symbol positions and basis element positions by both the encoder and decoder for the same key I. Additionally, BW(x) should be chosen to be the same value by both the encoder and decoder for the same index x. Also, the list BAL(x) of input symbol positions associated with each basis element BE(x) should be chosen to contain the same list of input symbol positions by both the encoder and decoder for the same basis element index x.

Embodiments of the associator 508, basis element associator 516, and associate reformatter 524 of a decoder will now be described. Similar embodiments maybe used in the encoder 155 and basis element generator 117 of FIGS. 1, 4, and 6 to generate W(I), AISL(I), ABEL(I), BW(x), and BAL(x).

The associator 508, basis element associator 516, and associate reformatter 524 are objects that calculate or generate AL(I) from I and usually W(I), J and K. In one embodiment, W(I), ABEL(I), AISL(I), BW(x), and BAL(x) are determined in a manner designed to mimic a random process. To satisfy the requirement that the encoder and decoder produce the same result with respect to the same key, a pseudo-random sequence could be generated by both encoder and decoder seeded with the key. Instead of a pseudo-random sequence, a truly random sequence might be used for the generation of W(I) and/or BAL(x), AISL(I) and ABEL(I), but for that to be useful, the random sequence used for generating W(I), BAL(x), AISL(I) and ABEL(I) would need to be communicated to the recipient.

In the decoder shown in FIG. 8, the output symbol buffer 531 requires storage for each output symbol's list of positions of associates, i.e., storage in the column labeled AL(I). The more efficient decoder shown in FIG. 9 does not require this storage, because a list of associates is recalculated as it is needed, e.g., as shown in FIGS. 15–19. There is an advantage in recalculating associate lists each time in order to save storage only if these calculations can be done quickly as needed.

Figure 15:
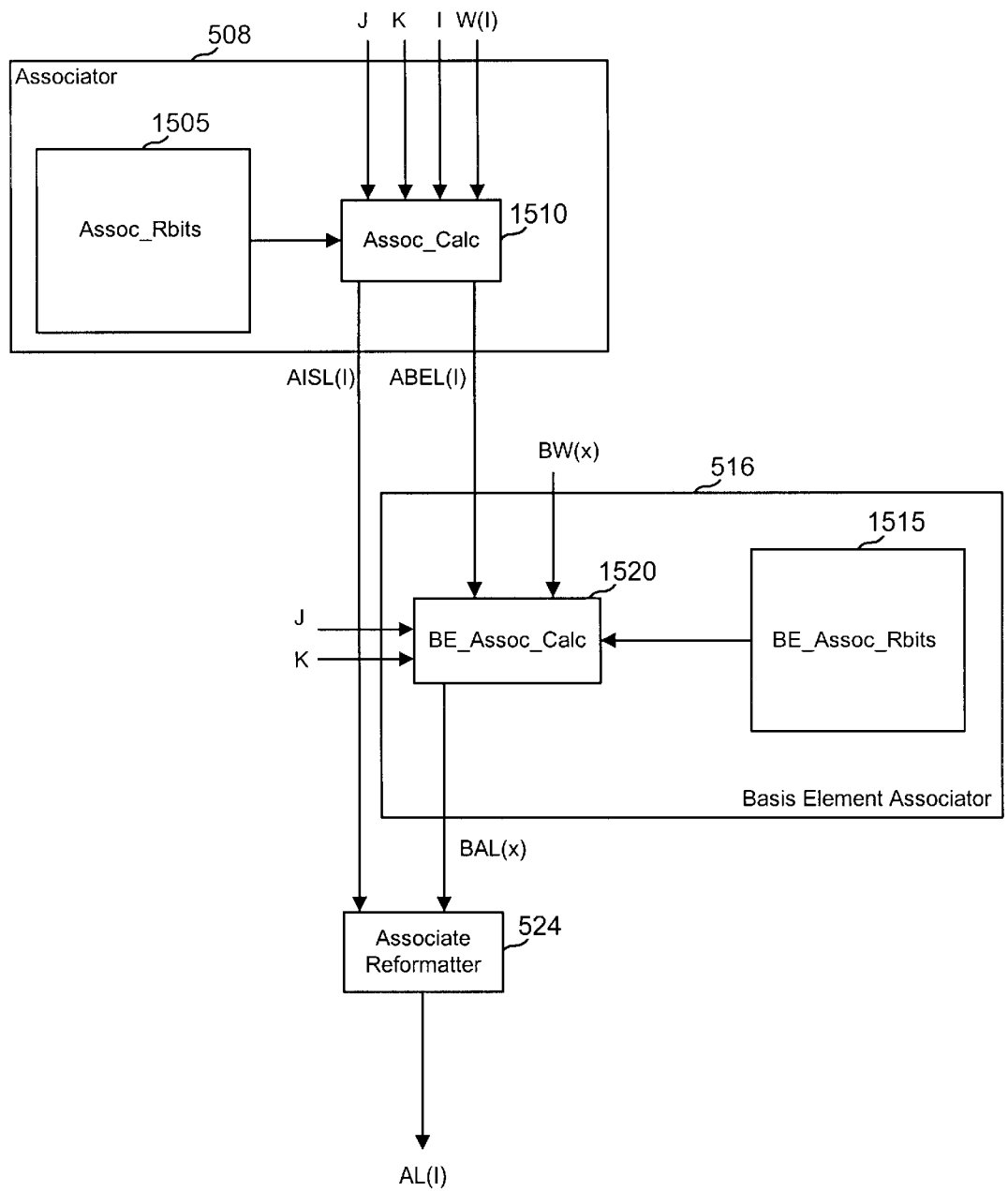
FIG. 15 is a block diagram illustrating an embodiment of an associator and associate reformatter.

One embodiment of the associator 508, the basis element associator 516, and the associate reformatter 524, is shown in FIG. 15. The input to associator 508 is a key I, the number K of input symbols, the number J of basis elements, and a weight W(I).

The output of the associate reformatter 524 is the list AL(I) of input symbol positions associated with the output symbol with key I. As shown in FIG. 15, the associator 508 comprises a table ASSOC_RBITS 1505 of random bits, and a calculator ASSOC_CALC 1510. The basis element associator 516 comprises a table BE_ASSOC_RBITS 1515 of random bits, and a calculator BE_ASSOC_CALC 1520.

Before a specific AISL(I) and ABEL(I) are generated, the size of the input file is adjusted so that the number of input symbols is prime. Thus, if the input file begins with K input symbols, the smallest prime number, P, greater than or equal to K is identified. If P is greater than K, P-K blank (e.g., set to zero) input symbols are added to the input file and K is reset to P. For this modified input file, lists AISL(I) of positions of associates are computed as shown in FIG. 17.

The number of basis elements is also adjusted to be prime. Thus, if the number of basis elements is chosen to be J, the smallest prime number, Q, greater than or equal to J is identified. If Q is greater than J, Q-J additional basis elements may be generated, or some associates from each basis element may be removed and placed in the new Q-J basis elements so that there are Q basis elements of approximately equal weight, whose total weight is the same as the original J basis elements. Alternatively, J can be chosen to be prime at the start. For this modified set of basis elements, lists ABEL(I) of positions of associates are computed as shown in FIG. 18.

Figure 16:
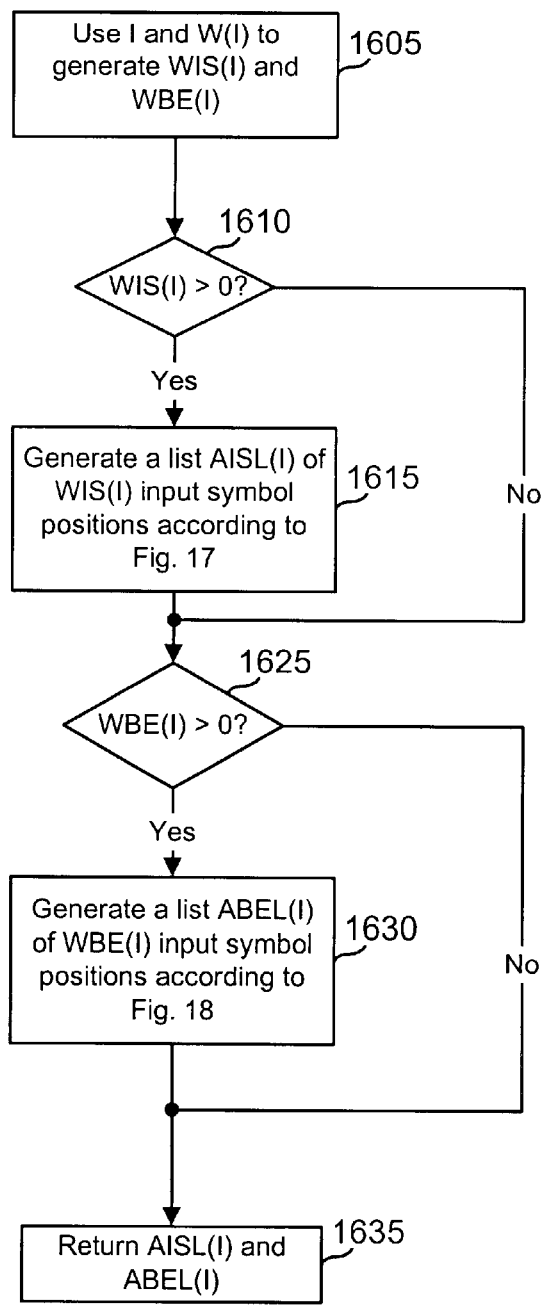
FIG. 16 is a flow diagram of a process that might be used by an associator, such as the associator shown in FIG. 15, to determine the association of input symbols with output symbols, and the association of basis elements with output symbols.
Figure 17:
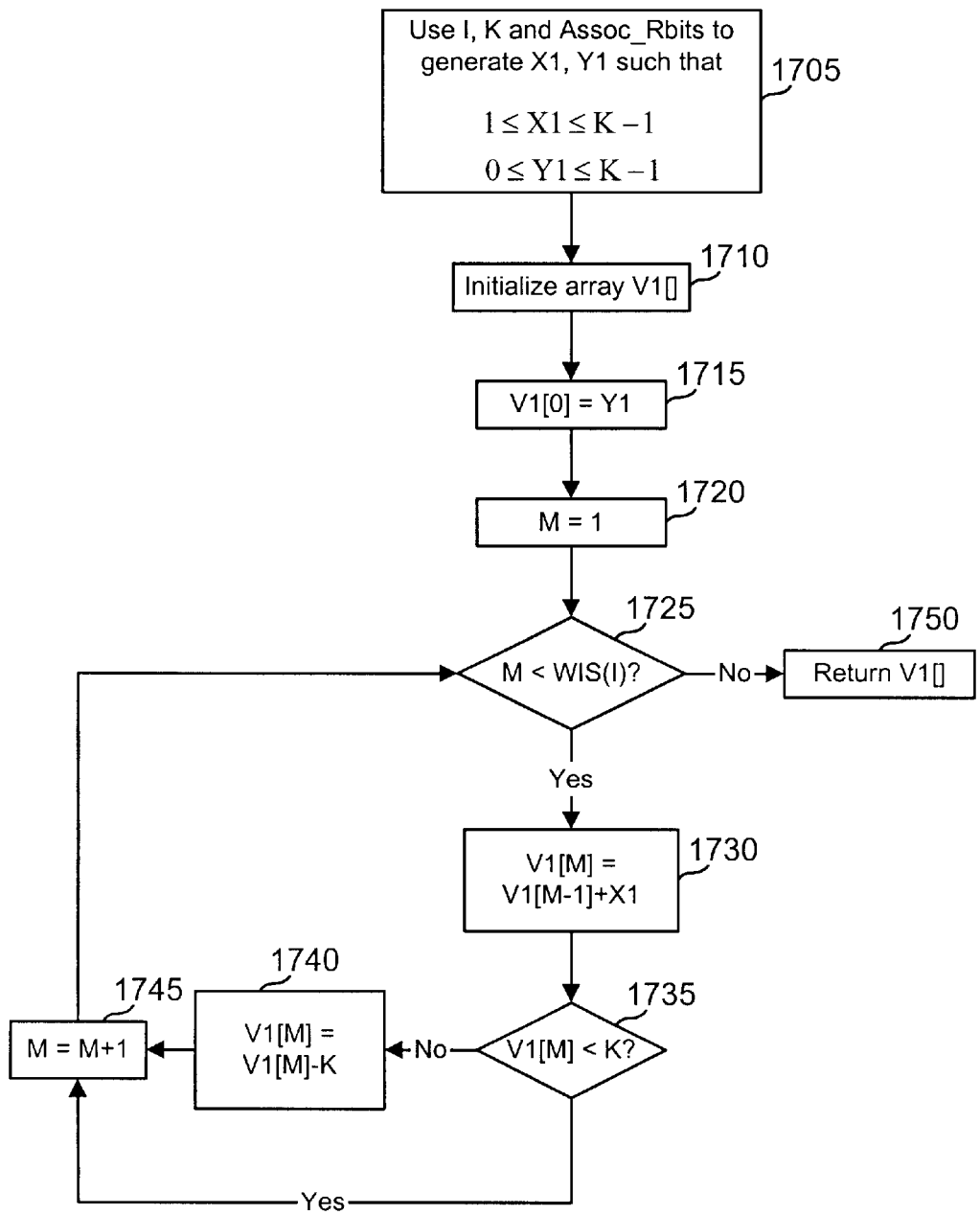
FIG. 17 is a flow diagram of a process that might be used by an associator, such as the associator shown in FIG. 15, to determine a list of associated input symbols.
Figure 18:
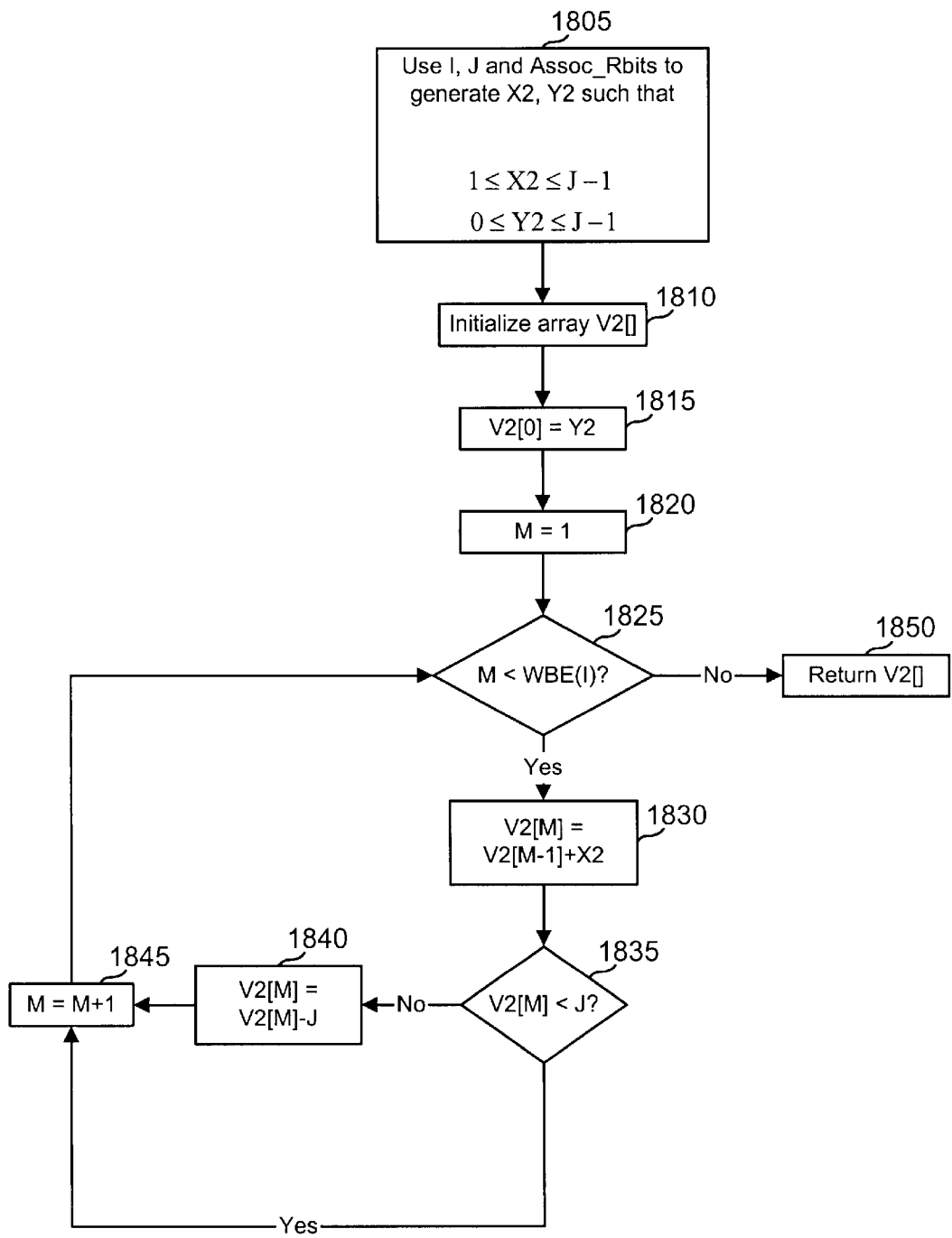
FIG. 18 is a flow diagram of a process that might be used by an associator, such as the associator shown in FIG. 15, to determine a list of associated basis elements.

Some embodiments of ASSOC_CALC 1510 operate according to the process shown in FIGS. 16–18. Although memory storage for AISL(I) and ABEL(I) at the encoder is not much of a concern, because the encoder does not normally need to store more than one set of lists AISL(I) and ABEL(I) at a time, the same process should be used at both the encoder and decoder to ensure that the values for AISL(I) and ABEL(I) are the same in both places.

Figure 19:
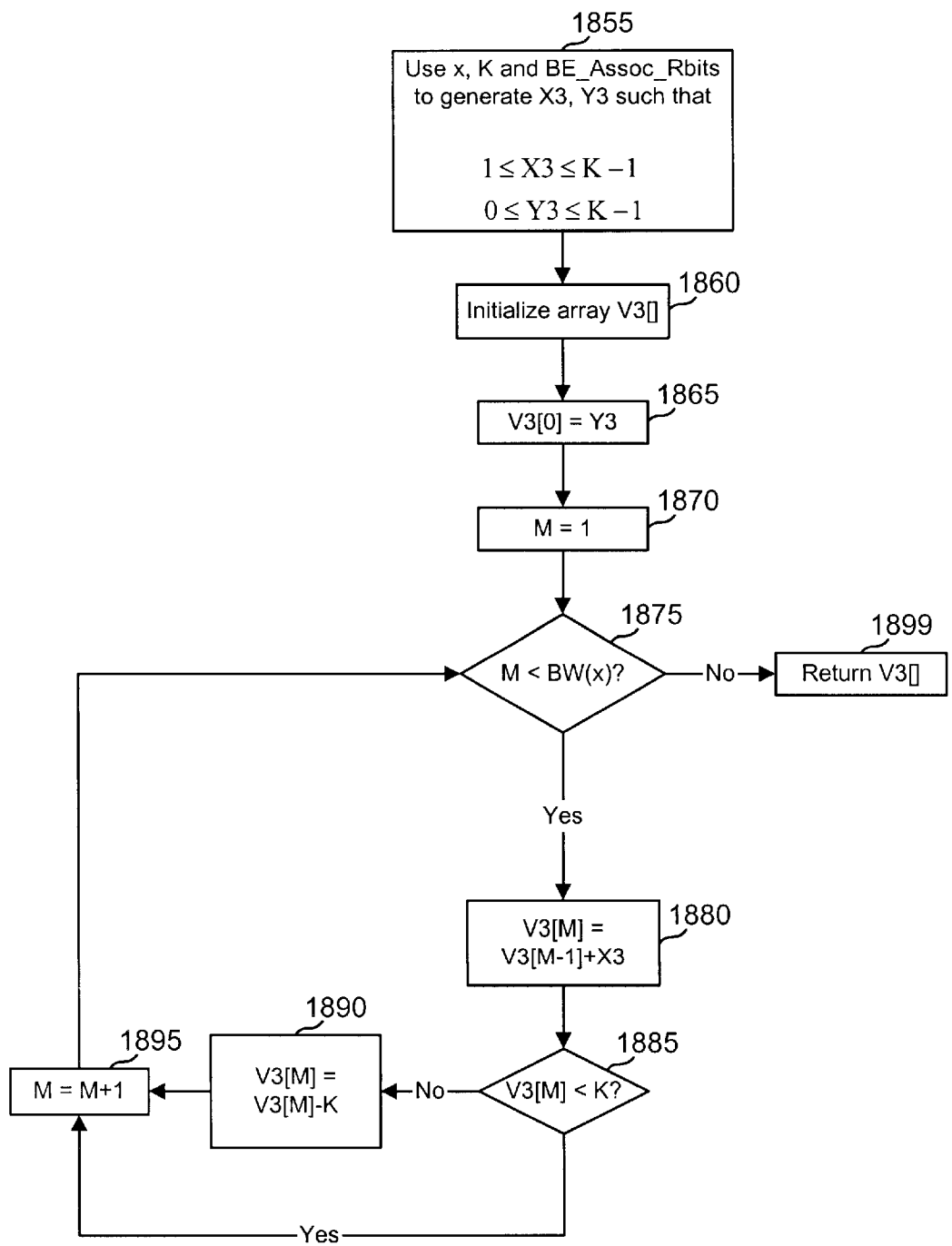
FIG. 19 is a flow diagram of a process that might be used by a basis element associator, such as the basis element associator shown in FIG. 15, to determine the list of input symbol associates of a basis element.

Some embodiments of BE_ASSOC_CALC 1520 operate according to the process shown in FIG. 19. The same process should be used at both the encoder and decoder to ensure that the values for the lists BAL(x) are the same for the same index x in both places.

In one embodiment the associate reformatter 524 simply takes the lists AISL(I) and BAL(x) and forms a single list containing every input symbol position that is either in AISL(I), or in the lists BAL(x) of basis element associates of a basis element in the list ABEL(I). The list may or may not contain duplicate input symbol positions that occur in more than one basis elements and/or once in AISL(I).

Thus, in one embodiment, the appearance of duplicate symbols is ignored and an input symbol that is associated with M>1 basis elements in ABEL(I), will appear M times in the list AL(I). Thus, in this embodiment, the weight adjuster 506 of FIG. 8 is not needed. In another embodiment, the number of times an input symbol appears in the list of associates AL(I) is dependent on the value function F(I), and the basis value functions BF(x). For instance, if the value functions are XOR, an input symbol that appears an even number of times in the combined lists of AISL(I) and lists BAL(x) of all the basis elements in ABEL(I) is effectively canceled out because the XOR of a value with itself is always zero. Therefore, the input symbol will not appear in the list AL(I). In this embodiment, an input symbol that appears M times in the combined lists of AISL(I) and lists BAL(x) of all the basis elements in ABEL(I) will appear M mod 2 times in AL(I).

In one embodiment, ASSOC_CALC 1510 operates as described below and as shown in the flowcharts of FIGS. 16–18. In this embodiment, each basis element is assumed to be of equal weight BW. In FIG. 16, the first step (1605) is to use the key I, and the weight W(I) to determine the number of input symbols, WIS(I), and the number of basis elements, WBE(I), associated with the output symbol, such that:

W(I)=WIS(I)+(BW*WBE(I)).

If WIS(I) is greater than zero (1610), i.e., the output symbol is associated with at least one input symbol that is not a part of a basis element, the ASSOC_CALC 1510 generates a list AISL(I) of WIS(I) input symbol positions (1615) according to the flow chart in FIG. 17. If WBE(I) is greater than zero (1625), i.e., the output symbol is associated with at least one basis element, the ASSOC_CALC 1510 generates a list ABEL(I) of WBE(I) input symbol positions (1630) according to the flow diagram in FIG. 16. The ASSOC_CALC 1510 returns the two lists AISL(I) and ABEL(I).

FIG. 17 is a flow diagram of a method for selecting the list AISL(I) of associates according to one embodiment of the invention. This diagram is merely for illustrative purposes and is not intended to limit the scope of the claims herein. The first step is to use key I, the number of input symbols K, and the table of random bits ASSOC_RBITS 905 to generate two integer values X1 and Y1 that have the property that X1 is at least one and at most K−1, and Y1 is at least zero and at most K−1 (1705). Preferably, X1 and Y1 are independently and uniformly distributed within their respective ranges. Next, an array V1[] with WIS(I) entries is initialized for storage of AISL(I) as its members are calculated (1710). Since V1[] is just temporary storage for one list, it would occupy much less memory than the AL(I) column of output symbol buffer 531 (see FIG. 8). V1[0] (this is the first element of the list AISL(I)) is set to Y1 (1715). Then, for all values of M starting at 1 and ending at WIS(I)-1, the value of V1[M] is set to (V 1[M−1]+ X1) mod K, as shown in steps 1720–1750. Since K is prime and WIS(I) is at most K, all of the V1[] values will be unique. As shown, the "mod K" operation can be a simple compare and subtract operation, i.e., steps 1735 and 1740. Thus, the process of producing the list of positions of associates of a given output symbol is very efficient.

FIG. 18 is a flow diagram of a method for selecting the list ABEL(I) of associates according to one embodiment of the invention. This diagram is merely for illustrative purposes and is not intended to limit the scope of the claims herein. The first step is to use key I, the number of basis elements J, and the table of random bits ASSOC_RBITS 1505 to generate two integer values X2 and Y2 that have the property that X2 is at least one and at most J−1, and Y2 is at least zero and at most J−1 (1805). Preferably, X2 and Y2 are independently and uniformly distributed within their respective ranges, as well as being independent from X1 and Y1 above. Next, an array V2[] with WBE(I) entries is initialized for storage of ABEL(I) as its members are calculated (1810). Since V2[] is just temporary storage for one list, it would occupy much less memory than the AL(I) column of output symbol buffer 531 (see FIG. 8). V2[0 ] (this is the first element of the list ABEL(I)) is set to Y2 (1815). Then, for all values of M starting at 1 and ending at WBE(I)-1, the value of V2[M] is set to (V2[M−1]+X 1) mod J, as shown in steps 1820–1850. Since J is prime and WBE(I) is at most J, all of the V2[] values will be unique. As shown, the "mod J" operation can be a simple compare and subtract operation, i.e., steps 1835 and 1840. Thus, the process of producing the list of positions of associates of a given output symbol is very efficient.

In one embodiment, BE_ASSOC_CALC 1520 operates as described below and as shown in the flowcharts of FIG. 19. For each basis element BE(x) associated with an output symbol the BE_ASSOC_CALC 1520 generates a list BAL (x) of BW(x) input symbol positions according to the flow chart in FIG. 19. The BE_ASSOC_CALC 1520 returns the lists BAL(x).

FIG. 19 is a flow diagram of a method for selecting the lists BAL(x) of associates according to one embodiment of the invention. This diagram is merely for illustrative purposes and is not intended to limit the scope of the claims herein. Other embodiments are listed below. The first step is to use x, the number of input symbols K, and the table of random bits BE_ASSOC_RBITS 1515 to generate two integer values X3 and Y3 that have the property that X3 is at least one and at most K-1, and Y2 is at least zero and at most K−1 (1855). Preferably, X3 and Y3 are independently and uniformly distributed within their respective ranges, as well as being independent from X1, X2, Y1 and Y2 above. Next, an array V3[] with BW(x) entries is initialized for storage of BAL(x) as its members are calculated (1860). Since V3[] is just temporary storage for one list, it would occupy much less memory than the AL(I) column of output symbol buffer 531 (see FIG. 8). V3[0] (this is the first element of the list BAL(x)) is set to Y3 (1865). Then, for all values of M starting at 1 and ending at BW(x)−1, the value of V3[M] is set to (V3[M−1]+X3) mod K, as shown in steps 1870–1899. Since K is prime and BW(x) is at most K, all of the V3[] values will be unique. As shown, the "mod K" operation can be a simple compare and subtract operation, i.e., steps 1885 and 1890. Thus, the process of producing the list of positions of associates of a given output symbol is very efficient.

In another embodiment, the basis element associator 516 generates each the list of associates for each basis element once, either as needed by the decoder or when the decoding process starts. In this embodiment, the basis element associator 516 simply looks up the list of associates for basis element BW(x) in a table, each time the list BAL(x) is requested and possibly generates the list of associate basis elements for BW(x) if it does not exist at the time. One advantage of the above approach to calculating AISL(I), BAL(x) and ABEL(I) is that it produces enough variety in the distribution on the positions of the associates to ensure that the decoding algorithm works with high probability with minimal reception overhead (i.e., the input file is recovered after receiving only slightly more than K output symbols, assuming input symbols and output symbols are the same length) when coupled with a good procedure for selecting WIS(I), WBE(I), and the weights of the basis elements.

Generating High Weight Output Symbols Using Basis Elements

Figure 20:
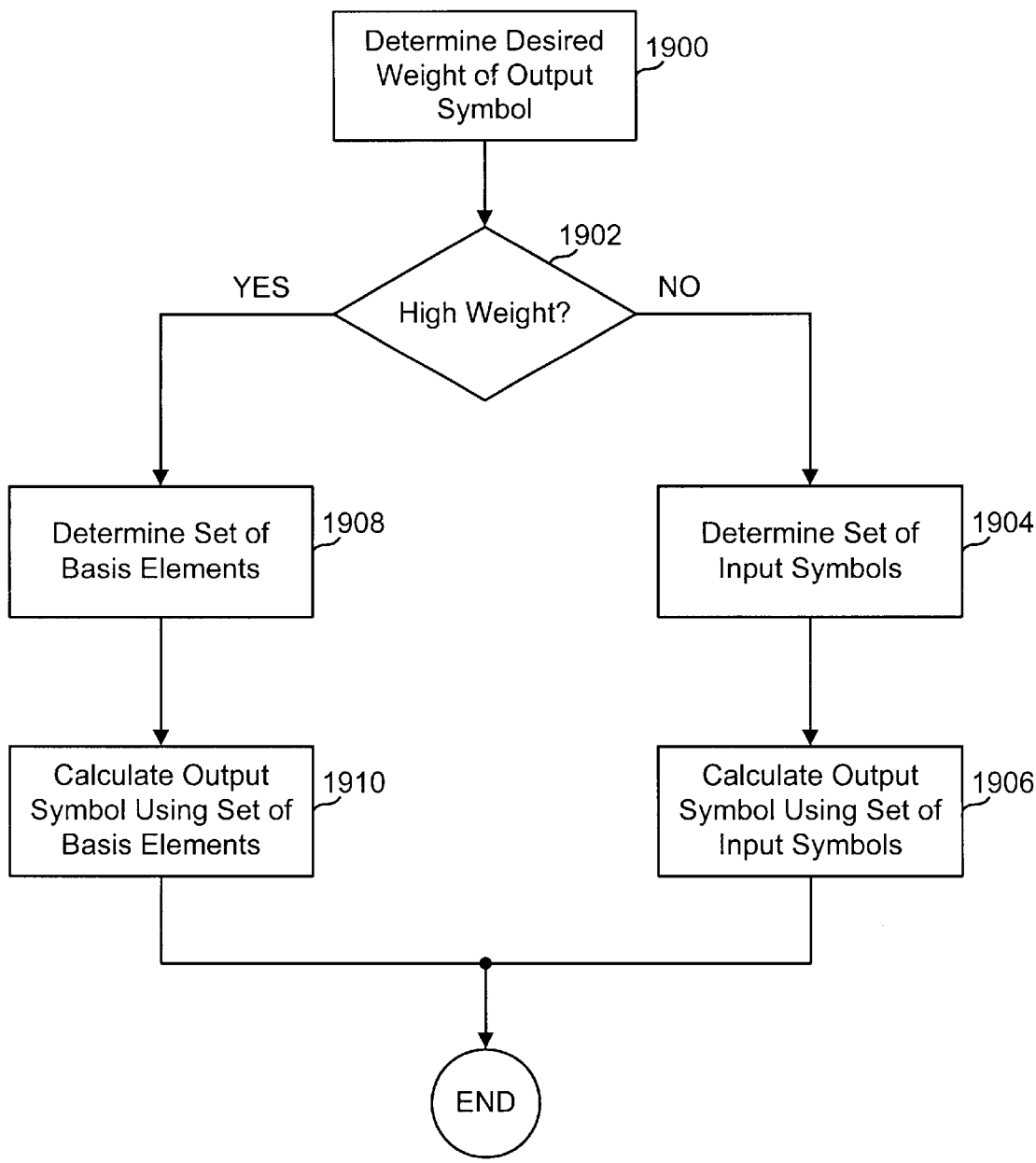
FIG. 20 is a flow diagram of a method of calculating output symbols according to one embodiment of the invention.

FIG. 20 is a simplified flow diagram of a method according to one embodiment of the invention that may be implemented by, for example, the system shown in FIGS. 1, 4, 6, and 8. This diagram is merely for illustrative purposes and is not intended to limit the scope of the claims herein.

FIG. 20 is a high level flow diagram illustrating one method of generating an output symbol. First, in a step 1900, a desired weight of the output symbol is determined. The desired weight may be determined, for example, by the weight selector 408 of FIG. 6. Then, the desired weight is examined, in a step 1902 to determine whether it is a high weight. For example, in some embodiments, the desired weight may be compared to a threshold. If the desired weight is above the threshold, then the weight is a high weight.

If, in step 1902, it is determined that the desired weight is not a high weight, then the output symbol is generated using only input symbols. First, a set of input symbols for generating the output symbol is determined in step 1904. A set of input symbols may be determined by, for example, the associator 406 of FIG. 6. Then, the output symbol is calculated in step 1906 using the set of input symbols determined in step 1904.

If, in step 1902, it is determined that the desired weight is a high weight, then the output symbol is generated using only basis elements. First, a set of basis elements for generating the output symbol is determined in step 1908. A set of basis elements may be determined by, for example, the associator 406 of FIG. 6. Additionally, the basis elements themselves may be generated, for example, by the basis element generator 117 of FIG. 4. Then, the output symbol is calculated in step 1910 using the set of basis elements determined in step 1908.

One skilled in the art will recognize many other variations, modifications, and alternatives to the flow illustrated in FIG. 20. For instance, it is to be understood that the desired weight of the output symbol need not be explicitly determined and then examined in steps 1900 and 1902. For example, a determination of whether the desired weight of an output symbol is a high weight may be made on the basis of the key I. In another embodiment, the associates of some output symbols may be a mix of both input symbols and basis elements, the associates of other output symbols may be only input symbols, and the associates of other output symbols may be only basis elements.

Examples of sets of basis elements that may be used to generate output symbols according to the method illustrated in FIG. 20 will now be described. It is to be understood, however, that many different sets of basis elements may also be used. It is also to be understood that these sets of basis elements may be used with methods other than the method illustrated in FIG. 20.

In a preferred embodiment, the weight BW(x) of each basis element is chosen to be approximately BW, wherein BW=K/(8H), wherein H is the largest power of 2 less than R, and wherein R is a parameter of weight distribution that is proportional to the fourth root of K. For instance, in Luby I, R is chosen to be equal to two plus twice the fourth root of K. For example, for a file K=102,400 input symbols, a typical value of R is 38. Thus, H is 32, and BW is 400.

In a preferred embodiment, the number J of basis elements is chosen to be the smallest prime greater than or equal to 2K/BW. The basis elements are written as BE(0), BE(1), ..., BE(J-1). Each input symbol in the file is part of exactly two basis elements. The basis elements are divided into two sets of size (J-1)/2 and (J+1)/2 respectively, where each set contains every input symbol in exactly one basis element. An index x of less than (J-1)/2-1 indicates a basis element in the first set and an index x of (J-1)/2 or more indicates a basis element in the second set.

The basis elements of the first set are formed as follows. The input symbols are written row by row in order of position into a table comprising (J-1)/2 columns. The number of input symbols in each column is either C=ceil(2K/(J-1)) or C-1, where ceil(z) is the smallest integer greater than or equal to z. The input symbols in column x are chosen to be the associates for basis element x. For example, if J=11 and there are 23 input symbols in the file IS(0), IS(1), IS(2), ..., IS(22), then Table 1 shows the input symbols written in a table comprising (J-1)/2=5 columns, where the first 3 columns contain C=ceil(2*23/10)=5 input symbols and the remaining 2 columns contain C-1=4 input symbols. The basis element BE(0) has the input symbols IS(0), IS(5), IS(10), IS(15), and IS(20) as associates. The basis element BE(1) has the input symbols IS(1), IS(6), IS(11), IS(16), and IS(21) as associates, and so on. In general, the basis element BE(x) has input symbols IS(x), IS(x+C), IS(x+2C), ..., IS(x+mC) as associates where m is the largest integer such that x+mC≦K-1, where x is less than (J-1)/2

TABLE 1

| BE(0) | BE(1) | BE(2) | BE(3) | BE(4) |
|---|---|---|---|---|
| IS(0) | IS(1) | IS(2) | IS(3) | IS(4) |
| IS(5) | IS(6) | IS(7) | IS(8) | IS(9) |
| IS(10) | IS(11) | IS(12) | IS(13) | IS(14) |
| IS(15) | IS(16) | IS(17) | IS(18) | IS(19) |
| IS(20) | IS(21) | IS(22) | | |

The basis elements of the second set are formed as follows. The input symbols are written column by column in order of position into a table comprising (J+1)/2 columns. The number of symbols in each column is equal to C=ceil (2K/(J+1)), where ceil(z) is the smallest integer greater than or equal to z. The last column contains any remaining input symbols. The input symbols in column x are chosen to be the associates for basis element x. For example, if J=11 and there are 23 input symbols in the file IS(0), IS(1), IS(2), ..., IS(22), then Table 2 shows the input symbols written in a table comprising (J+1)/2=6 columns, where the first 5 columns contain C=ceil(2*23/12)=4 input symbols and the last column contains the 3 remaining input symbols. The basis element BE(5) has the input symbols IS(0), IS(1), IS(2), and IS(3) as associates, the basis element BE(6) has the input symbols IS(4), IS(5), IS(6), and IS(7) as associates, and so on. In general, the basis element BE(x+(J-1)/2) has input symbols IS(Cx), IS(Cx+1), IS(Cx+2), ..., IS(Cx+C-1) as associates for x=0, ..., (J-3)/2 and BE(J-1) has input symbols IS(C(J-1)/2), IS(C(J-1)/2 30 1), ..., IS(K-1).

TABLE 2

| BE(5) | BE(6) | BE(7) | BE(8) | BE(9) | BE(10) |
|---|---|---|---|---|---|
| IS(0) | IS(4) | IS(8) | IS(12) | IS(16) | IS(20) |
| IS(1) | IS(5) | IS(9) | IS(13) | IS(17) | IS(21) |
| IS(2) | IS(6) | IS(10) | IS(14) | IS(18) | IS(22) |
| IS(3) | IS(7) | IS(11) | IS(15) | IS(19) | |

In another embodiment, the number J of basis elements is chosen as K/BW (i.e., reduced by a factor of 2), and each list BAL(x) of input symbols is chosen in a random or pseudo-random manner, such that each input symbol is part of at most one basis element. As described previously, the selection of the lists BAL(x) are performed in a way that the decoder can replicate if it does not already have the lists BAL(x) available to it.

Embodiments of methods for producing output symbol weights and determining associates for generating output symbols having the desired weights will now be described. In a specific embodiment, a desired weight of an output symbol is determined to be a high weight, if the weight is greater than a value K/R, where R is the parameter as described above. In this embodiment, the weight selector 408 of FIG. 6 is configured to generate only the following weights W(I): 1, 2, 3, ..., K/R, K/H, K/(H/2), bx;1K/(H/4), ..., K/8, K/4, K/2, K, where H is the largest power of two less than R, as described above. In a specific embodiment, the weight selector 408 first uses the key I to generate a pseudo-random number, and then uses that number to look up a value of W(I) in a distribution table.

Additionally, the associator 406 is configured to generate a list of only input symbols when W(I) is less than or equal to K/R, and only basis elements when W(I) is greater than K/R. In particular, when W(I) is less than or equal to K/R, the associator 406 generates a list AISL(I) of W(I) input symbols. When W(I) is greater than K/R, then the associator 406 generates a list ABEL(I) of W(I)/BW basis elements. For example, if BW is chosen to be K/(8H), then if W(I)= K/(H/$2^i$), the list ABEL(I) will contain $2^{i+3}$ basis elements of weight BW.

Variations on Generating High Weight Output Symbols Using Basis Elements

It is to understood that the embodiments described with respect to FIG. 20 are only examples of methods of generating output symbols using basis elements and/or input symbols. One skilled in the art will recognize many other modifications, variations, and alternatives.

Figure 21:
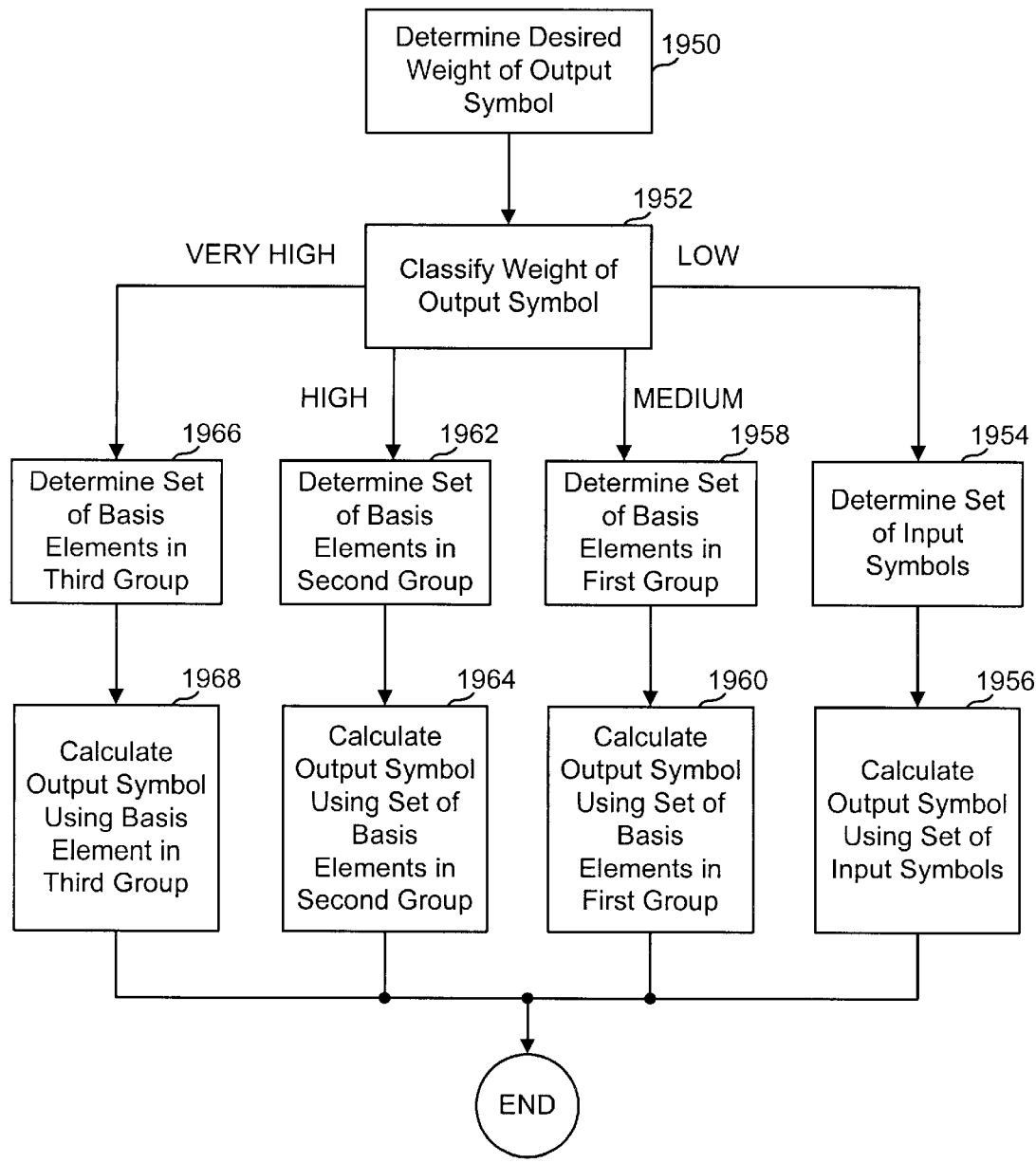
FIG. 21 is a flow diagram of another method of calculating output symbols according to another embodiment of the invention.

For example, in the methods described with respect to FIG. 20, weights of output symbols are classified as high weight or low weight. However, the weights of output symbols may be classified into numerous categories. For example, FIG. 21 illustrates a simplified flow diagram of a method according to another embodiment of the invention where output symbol weights are classified into four categories. This diagram is merely for illustrative purposes and is not intended to limit the scope of the claims herein.

In FIG. 21, an output symbol weight is classified in a step 1952 into one of four categories: low weight, medium weight, high weight, and very high weight. The classification may be made, for example, by comparing the weight W(I) to various thresholds. If the output symbol weight W(I) is determined to be a low weight, then the flow proceeds to steps 1954 and 1956. In these steps, an output symbol is calculated using input symbols in a manner similar to that as described with respect to steps 1904 and 1906 in FIG. 20.

If the output symbol weight W(I) is determined to be a medium weight, then the flow proceeds to steps 1958 and 1960. In these steps, an output symbol is calculated using basis elements from a first group of basis elements in manner similar to that as described with respect to steps 1908 and 1910 of FIG. 20. Similarly, if W(I) is determined to be a high weight, then the flow proceeds to steps 1962 and 1964. In steps 1962 and 1964, an output symbol is calculated using basis elements from a second group of basis elements, different than the first group of basis elements. Also, if W(I) is determined to be of very high weight, then the flow proceeds to steps 1966 and 1968. In steps 1966 and 1968, an output symbol is calculated using basis elements from a third group of basis elements, different than the first and second groups.

Basis elements in each of the groups may have a different weights. Additionally, each group may have a different number of basis elements. In a specific embodiment, the third group comprises only one basis element. This basis element is calculated using all K input symbols.

Basis Elements to Recover Any Two Missing Input Symbols

As has been previously described, many different types of sets of basis elements may be used with the present invention. Specific examples of possible basis element sets were described with respect to FIGS. 9 and 10. Now, additional examples of basis element sets will be described.

In some embodiments, a set of basis elements are generated such that if all of the basis elements in the set are received, a decoder may recover any two unrecovered input symbols, provided the remaining input symbols have already been recovered. Transmitting such a set of basis elements may be useful, for example, if a receiver has recovered all but two input symbols, and cannot recover those two input symbols with the output symbols it has thus far received.

If there are K input symbols, then the number J of basis elements in the set is L+1, where L=ceil($\log_2$K), and where ceil(z) is the smallest integer greater than or equal to z. As described previously, each basis element BE(x) has a position denoted by the integer in the parentheses. Thus, each basis element BE(x) may be indexed by an integer from 0 to J−1 (i.e., BE(0), BE(1), . . . , BE(J-1)). As also previously described, each input symbol has a position, and thus may be indexed by an integer from 0 to K−1 (i.e., IS(0), IS(1), . . . , IS(K-1)). In one embodiment, the list BAL(x) of input symbols used for generating a basis element BE(x) is determined as follows. Indices of the input symbols may be written in binary form. Table 3 illustrates examples of input symbol indices written in binary form. Note that L binary digits are required to represent the input symbol indices from 0 to K−1.

TABLE 3

| IS(z) | IS($a_{L-1}$ $a_{L-2}$ . . . $a_2$ $a_1$ $a_0$) |
|---|---|
| IS(0) | IS(0 0 . . . 0 0 0) |
| IS(1) | IS(0 0 . . . 0 0 1) |
| IS(2) | IS(0 0 . . . 0 1 0) |
| IS(3) | IS(0 0 . . . 0 1 1) |
| IS(4) | IS(0 0 . . . 1 0 0) |
| IS(5) | IS(0 0 . . . 1 0 1) |
| IS(6) | IS(0 0 . . . 1 1 0) |
| . | . |
| . | . |
| . | . |

Associated input symbols for each of the basis elements BE(x) from BE(0) to BE(L-1) are chosen such that all input symbols in which the x-th binary digit in the index is 1 (i.e., $a_x$=1) are associates of BE(x). Thus, the list BAL(0) includes each of the input symbols in which the binary digit $a_0$ of its index is one. Similarly, the list BAL(1) includes each of the input symbols in which the binary digit $a_1$ of its index is one. Table 4 illustrates examples of basis elements and the corresponding list of input symbols used to generate the basis elements.

TABLE 4

| BE(x) | BAL(x) |
|---|---|
| BE(0) | BAL(0) includes all input symbols with an index in which $a_0$ = 1. |
| BE(1) | BAL(1) includes all input symbols with an index in which $a_1$ = 1. |
| BE(2) | BAL(2) includes all input symbols with an index in which $a_2$ = 1. |
| . | . |
| . | . |
| . | . |
| BE(L-1) | BAL(L-1) includes all input symbols with an index in which $a_{L-1}$ =1. |

Note that if K is a power of 2, then each of the basis elements BE(0) to BE(L-1) will be generated using exactly K/2 input symbols. Also note that if K=$2^c$+1 for some integer c, then the L-th basis element will comprise exactly one input symbol. Finally, an additional basis element BE(L) is provided which is generated using all K input symbols.

An explanation of why the above-described set of basis elements allows the recovery of any two input symbols when the remaining input symbols have already been recovered will now be described. Consider the indices of first and second unrecovered input symbols. The binary representation of their indices must differ in at least one binary digit. Say, for example, that a difference occurs at the binary digit $a_D$. In particular, for the first unrecovered input symbol, $a_D$=1, and for the second unrecovered input symbol, $a_D$=0. Hence, the first unrecovered input symbol is an associate of BE(D), whereas the second unrecovered input symbol is not. Because the remaining input symbols have already been recovered, the first unrecovered input symbol may be recovered from BE(D). Now, the second unrecovered input symbol is the only remaining unrecovered input symbol. This input symbol may be recovered using the basis element BE(L), which includes all the input symbols as its associates.

Another embodiment of a set of basis elements will now be described with respect to Table 5. In Table 5, an input symbol associated with a basis element is indicated by a one, and an input symbol not associated is indicated by a zero. Table 5 assumes that the number K of input symbols is a power of two. A first basis element (e.g., BE(0)) includes the first K/2 input symbols, and does not include the second K/2 symbols. A second basis element (e.g., BE(1)) includes the first and third quarters of the input symbols. A third basis element (e.g. BE(2)) includes the first, third, fifth, and seventh eighths of the input symbols. Similarly, the remaining basis elements are generated, with the L-th basis element including every other input symbol.

TABLE 5

| BE(x) | IS(1) | | | | IS(K) |
|---|---|---|---|---|---|
| BE(0) | 1 1 1 | ... | 1 1 1 0 0 0 | ... | 0 0 0 |
| BE(1) | 1 1 1... | 1 1 1 0 0 0 | ...0 0 0 1 1 1... | 1 1 1 0 0 0 | ...0 0 0 |
| . | | | . | | |
| . | | | . | | |
| . | | | . | | |
| BE(L-1) | 1 0 1 0 1 0 | | ... | | 1 0 1 0 1 0 |

If K=2$^c$+1 for some integer c, then L–1 basis elements may be generated as described with respect to Table 5 with a set of 2$^c$ input symbols, and an L-th basis element may be generated using the remaining input symbol. The above-described set of basis elements also permits the recovery of any two input symbols provided the remaining input symbols have already been recovered.

In both of the above-described embodiments, output symbols may be generated using a plurality of the basis elements. One skilled in the art will understand that a list of basis elements used to generate an output symbol may be selected in any number of ways. For example, the list of basis elements may be selected randomly, pseudo-randomly, or the like. Preferably, the list of basis elements is selected, such that the receiver can reconstruct the list if it does not already have the list. Alternatively, the basis elements may themselves be sent as output symbols.

A Set of Basis Elements to Generate an Output Symbol of Weight W From at Most log$_2$W Basis Elements Another embodiment of a set of basis elements and a method of generating output symbols with the set of basis elements will now be described. In this embodiment, an output symbol of weight W can be generated using at most log$_2$W basis elements.

In this embodiment, L different groups of basis elements are generated, wherein L=ceil(log$_2$K). The L groups of basis elements may be denotes as $G_0, G_1, \ldots G_{L-1}$. Each group of basis elements comprises basis elements having a same weight, and each group has a different weight. In particular, each group $G_c$ of basis elements comprises basis elements having a weight of 2$^c$. Each basis element in a group may be generated using 2$^c$ input symbols that may be selected using any of the methods heretofore described, or the like. Note that the total number J of basis elements varies depending on how many basis elements are generated for each of the groups $G_1, \ldots G_L$. In general, the larger the number of basis elements of each weight, the larger the number of possible output symbols.

Generating an output symbol of weight W using the above-described set of basis elements will now be described. First, the weight W may be written as a binary number comprising L digits, each digit having a position denoted by a subscript as follows: $w_L w_{L-1} \ldots w_2 w_1$. Then, basis elements for generating the output symbol may be selected as follows. For each binary digit $w_z$ that is a one, a basis element having a weight 2$^z$ (i.e., a basis element from the group $G_z$) is selected. A basis element may be selected from a group $G_z$, using any of the methods heretofore described, or the like. The selected basis elements are then used to generate an output symbol as previously described. Note that if an input symbol appears in more than one of the selected basis elements, the actual weight of the output symbol may be less than W as described previously. Thus, in other embodiments, additional input symbols and/or basis elements may be used to generate the output symbol in order to adjust the actual output symbol weight to W.

The choice of writing the weight W as a binary basis elements is also arbitrary. In general, L groups of basis elements can be generated wherein L=ceil(log$_p$K), wherein each group $G_c$ of basis elements comprises basis elements having a weight of P$^c$. The weight W may be written as a P-ary number comprising L digits, each digit having a position denoted by a subscript as follows: $w_L w_{L-1} \ldots w_2 w_1$. For each P-ary digit $w_z$ that is not zero, i.e., $w_z$ is an integer C between zero and p, C basis elements having a weight P$^z$ (i.e. a basis element from the group $G_z$) are selected.

The invention has now been explained with reference to specific embodiments. Other embodiments will be apparent to those of ordinary skill in the art. Therefore, it is not intended that the invention be limited except as indicated by the appended claims.

What is claimed is:

1. A method of generating output symbols, wherein each output symbol is selected from an output alphabet and each output symbol is such that an input file, comprising an ordered plurality of input symbols each selected from an input alphabet, is recoverable from a set of such output symbols, the method comprising:
   generating a plurality of basis elements, wherein each basis element is generated from a predetermined function of associated input symbols associated with the basis element;
   for each output symbol:
      determining a set of associated basis elements associated with the output symbol;
      determining a set of direct associated input symbols directly associated with the output symbol; and
      generating the output symbol from a predetermined function of the associated basis elements and the direct associated input symbols.

2. The method of claim 1, wherein for some or all of the output symbols, the set of direct associated input symbols is the empty set.

3. The method of claim 1, wherein for some or all of the output symbols, the set of associated basis elements is the empty set.

4. The method of claim 1, wherein for a first subset of the output symbols, the set of direct associated input symbols is the empty set; and wherein for a second subset of the output symbols, the set of associated basis elements is the empty set.

5. The method of claim 1, wherein generating a plurality of basis elements includes generating first and second sets of basis elements; wherein for a first subset of the output symbols, the set of associated basis elements includes only basis elements from the first set of basis elements; and wherein for a second subset of the output symbols, the set of associated basis elements includes only basis elements from the second set of basis elements.

6. The method of claim 1, wherein some or all of the plurality of basis elements are generated prior to generating any of the output symbols.

7. The method of claim 1, wherein, for some or all of the plurality of basis elements, each of the some or all of the plurality of basis elements is generated upon a first appearance of the basis element in a set of associated basis elements associated with an output symbol.

8. The method of claim 1, further including, for each output symbol, determining a desired weight of the output symbol.

9. The method of claim 8, wherein the set of associated basis elements and the set of direct associated input symbols are determined such that a weight of the generated output symbol at least approximates the desired weight.

10. The method of claim 8, wherein, for at least one output symbol, the desired weight of the at least one output symbol is equal to a sum of the number of the direct associated input symbols and a weight of each of the associated basis elements.

11. The method of claim 8, wherein, for at least one output symbol, the desired weight of the at least one output symbol is less than the sum of the number of the direct associated input symbols and a weight of each of the associated basis elements.

12. The method of claim 1, wherein the plurality of basis elements includes a set of basis elements, and wherein each of the basis elements of the set have the same weight.

13. The method of claim 1, wherein the plurality of basis elements includes a set of basis elements; and wherein the associated input symbols of each of the basis elements in the set includes one half of the associated input symbols of any other of the basis elements in the set.

14. The method of claim 1, wherein the plurality of basis elements includes a plurality of sets of basis elements; wherein each of the plurality of sets includes a plurality of basis elements, the basis elements having a weight $P^c$, wherein P and c are integers; and wherein, for each of the plurality of sets, c is a different integer.

15. The method of claim 1, wherein, for at least one of the plurality of basis elements, the predetermined function of associated input symbols associated with the basis element is XOR.

16. The method of claim 1, wherein, for each of the plurality of basis elements, the predetermined function of associated input symbols associated with the basis element is XOR.

17. A data signal comprising output symbols, wherein each output symbol is selected from an output alphabet and each output symbol is such that an input file, comprising an ordered plurality of input symbols each selected from an input alphabet, is recoverable from a set of such output symbols, wherein the output symbols are generated using a method comprising:

generating a plurality of basis elements, wherein each basis element is generated from a predetermined function of associated input symbols associated with the basis element;

for each output symbol:

determining a set of associated basis elements associated with the output symbol;

determining a set of direct associated input symbols directly associated with the output symbol; and generating the output symbol from a predetermined function of the associated basis elements and the direct associated input symbols.

18. The data signal of claim 17, wherein for some or all of the output symbols, the set of direct associated input symbols is the empty set.

19. The data signal of claim 17, wherein for some or all of the output symbols, the set of associated basis elements is the empty set.

20. The data signal of claim 17, wherein for a first subset of the output symbols, the set of direct associated input symbols is the empty set; and wherein for a second subset of the output symbols, the set of associated basis elements is the empty set.

21. The data signal of claim 17, wherein generating a plurality of basis elements includes generating first and second sets of basis elements; wherein for a first subset of the output symbols, the set of associated basis elements includes only basis elements from the first set of basis elements; and wherein for a second subset of the output symbols, the set of associated basis elements includes only basis elements from the second set of basis elements.

22. The data signal of claim 17, wherein some or all of the plurality of basis elements are generated prior to generating any of the output symbols.

23. The data signal of claim 17, wherein, for some or all of the plurality of basis elements, each of the some or all of the plurality of basis elements is generated upon a first appearance of the basis element in a set of associated basis elements associated with an output symbol.

24. The data signal of claim 17, further including, for each output symbol, determining a desired weight of the output symbol.

25. The data signal of claim 24, wherein the set of associated basis elements and the of set direct associated input symbols are determined such that a weight of the generated output symbol at least approximates the desired weight.

26. The data signal of claim 24, wherein, for at least one output symbol, the desired weight of the at least one output symbol is equal to a sum of the number of the direct associated input symbols and a weight of each of the associated basis elements.

27. The data signal of claim 24, wherein, for at least one output symbol, the desired weight of the at least one output symbol is less than the sum of the number of the direct associated input symbols and a weight of each of the associated basis elements.

28. The data signal of claim 17, wherein the plurality of basis elements includes a set of basis elements, and wherein each of the basis elements of the set have the same weight.

29. The data signal of claim 17, wherein the plurality of basis elements includes a set of basis elements; and wherein the associated input symbols of each of the basis elements in the set includes one half of the associated input symbols of any other of the basis elements in the set.

30. The data signal of claim 17, wherein the plurality of basis elements includes a plurality of sets of basis elements; wherein each of the plurality of sets includes a plurality of basis elements, the basis elements having a weight $P^c$, wherein P and c are integers; and wherein, for each of the plurality of sets, c is a different integer.

31. The data signal of claim 17, wherein, for at least one of the plurality of basis elements, the predetermined function of associated input symbols associated with the basis element is XOR.

32. The data signal of claim 17, wherein, for each of the plurality of basis elements, the predetermined function of associated input symbols associated with the basis element is XOR.

33. A method of decoding an input symbol from output symbols, wherein the output symbols are selected from an output alphabet and output symbols are such that an input file, comprising an ordered plurality of input symbols each selected from an input alphabet, is recoverable from a set of such output symbols, and wherein each output symbol has a value calculated from one or more direct associated input symbols and/or one or more associated basis elements, the method comprising:

for each output symbol:
  determining a set of direct associated input symbols directly associated with the output symbol;
  determining a set of indirect associated input symbols indirectly associated with the output symbol;
  determining a weight of the output symbol;
  initializing a count of the output symbol to the weight of the output symbol;

recovering input symbols using output symbols that have a count less than or equal to a recovery value; and reducing the count of an output symbol of which a recovered input symbol is an associate to reflect the recovery of the associated input symbol.

34. The method of claim 33, further comprising calculating a reduced value for an output symbol based on a recovered input symbol associated with the output symbol, wherein the reduced value is an output symbol value that is independent of the recovered input symbol associate.

35. The method of claim 33, wherein recovering input symbols further includes using recovered input symbols associated with the output symbols that have a count less than or equal to a recovery value.

36. The method of claim 33, wherein for some or all of the output symbols, the set of direct associated input symbols is the empty set.

37. The method of claim 33, wherein for some or all of the output symbols, the set of indirect associated input symbols is the empty set.

38. The method of claim 33, wherein for a first subset of the output symbols, the set of direct associated input symbols is the empty set; and wherein for a second subset of the output symbols, the set of indirect associated input symbols is the empty set.

39. The method of claim 33, wherein the recovery value is one.

40. The method of claim 33, wherein determining a set of indirect associated input symbols includes:

determining a set of associated basis elements associated with the output symbol; and for each associated basis element, determining a set of input symbols associated with the basis element.

41. The method of claim 40, wherein determining a set of input symbols associated with the basis element includes:

determining whether the set of input symbols associated with the basis element was previously determined;

if no, determining the set of input symbols associated with the basis element, and storing the set of input symbols associated with the basis element in a memory; and if yes, retrieving the set of input symbols associated with the basis element from the memory.

42. The method of claim 40, further comprising:

recovering basis elements using recovered input symbols;

reducing the count of an output symbol of which a recovered basis element is an associate to reflect the recovery of the associated basis element; and wherein recovering input symbols further includes using recovered basis elements associated with the output symbols that have a count less than or equal to a recovery value.

* * * * *